United States Patent
Chen et al.

(10) Patent No.: US 10,361,145 B2
(45) Date of Patent: Jul. 23, 2019

(54) THROUGH-MOLD OPENINGS FOR DUAL-SIDED PACKAGED MODULES WITH BALL GRID ARRAYS

(71) Applicant: SKYWORKS SOLUTIONS, INC., Woburn, MA (US)

(72) Inventors: Howard E. Chen, Anaheim, CA (US); Robert Francis Darveaux, Corona Del Mar, CA (US); Hoang Mong Nguyen, Fountain Valley, CA (US); Anthony James Lobianco, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/035,589

(22) Filed: Jul. 14, 2018

(65) Prior Publication Data

US 2019/0057929 A1    Feb. 21, 2019

Related U.S. Application Data

(60) Provisional application No. 62/534,052, filed on Jul. 18, 2017.

(51) Int. Cl.
| | |
|---|---|
| *H01L 21/56* | (2006.01) |
| *H01L 23/00* | (2006.01) |
| *H01L 23/48* | (2006.01) |
| *H01L 23/66* | (2006.01) |
| *H01L 23/498* | (2006.01) |
| *H01L 23/552* | (2006.01) |

(52) U.S. Cl.
CPC .......... *H01L 23/481* (2013.01); *H01L 21/565* (2013.01); *H01L 23/49816* (2013.01); *H01L 23/552* (2013.01); *H01L 23/66* (2013.01); *H01L 24/17* (2013.01); *H01L 24/97* (2013.01); *H01L 2924/15311* (2013.01)

(58) Field of Classification Search
CPC ...... H01L 23/481; H01L 21/565; H01L 23/66
USPC ........................................................ 257/774
See application file for complete search history.

(56) References Cited

U.S. PATENT DOCUMENTS

| | | | | |
|---|---|---|---|---|
| 2013/0294622 A1* | 11/2013 | Kasai | ................... | H04R 19/005 381/162 |
| 2014/0072151 A1* | 3/2014 | Ochs | ...................... | H04R 23/00 381/174 |

* cited by examiner

*Primary Examiner* — Elias Ullah
(74) *Attorney, Agent, or Firm* — Chang & Hale LLP

(57) ABSTRACT

Modules, devices and methods of manufacturing a dual-sided module are disclosed. A dual-sided module includes a packaging substrate having an upper side, a lower side, and a ground plane, a radio-frequency circuit assembly implemented on both of the upper and lower sides of the packaging substrate and an upper overmold implemented on the upper side of the packaging substrate defining one or more openings dimensioned to expose contact pads on the upper side. The module further includes a conductive layer configured to provide shielding for a region on the upper side of the packaging substrate, a lower overmold implemented on the lower side of the packaging substrate to cover a lower portion of the radio-frequency circuit assembly, the lower overmold defining a plurality of openings, and a contact feature implemented within each of the openings of the lower overmold to be in contact with the packaging substrate.

20 Claims, 20 Drawing Sheets

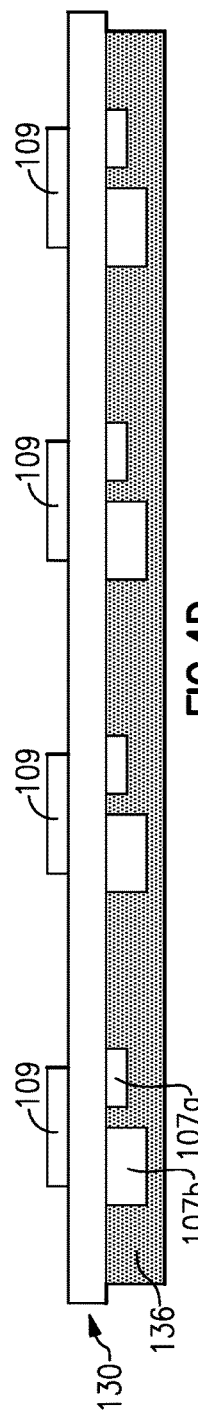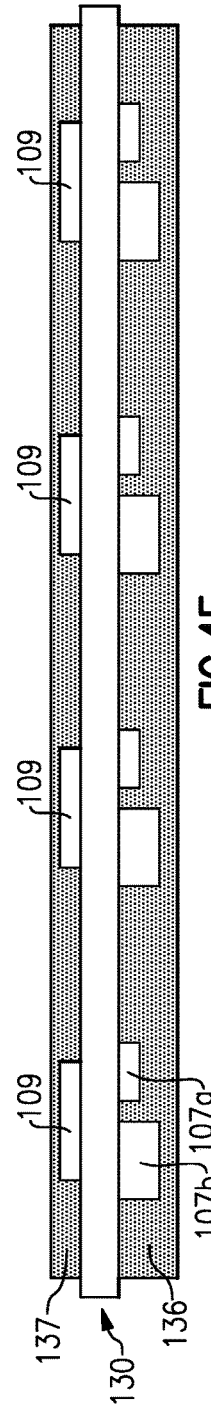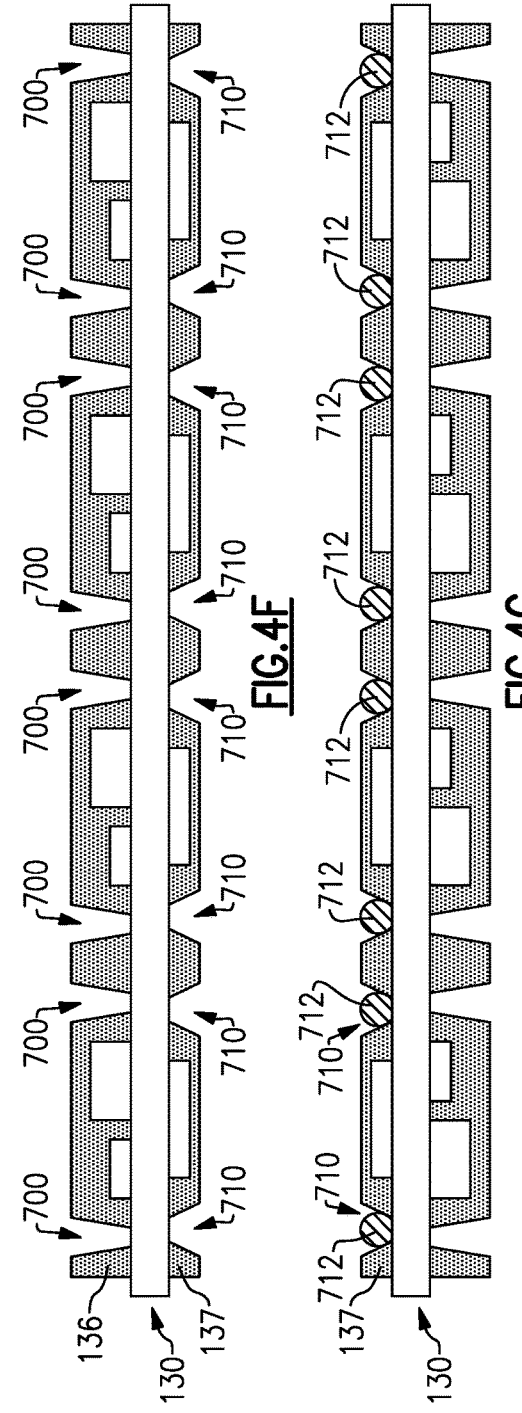

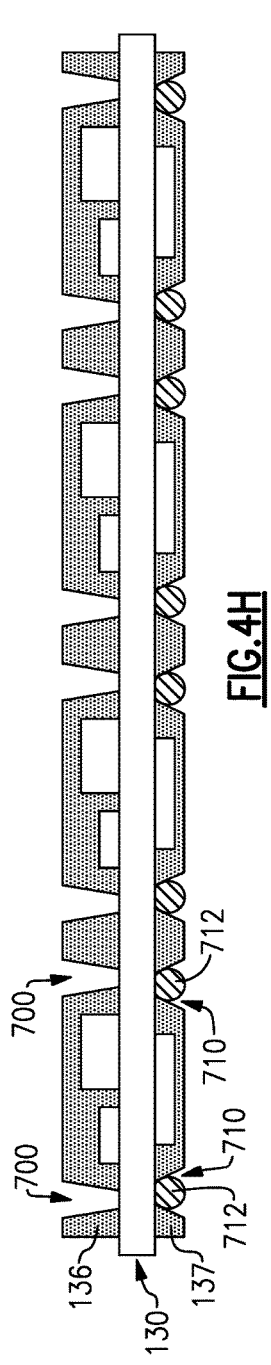
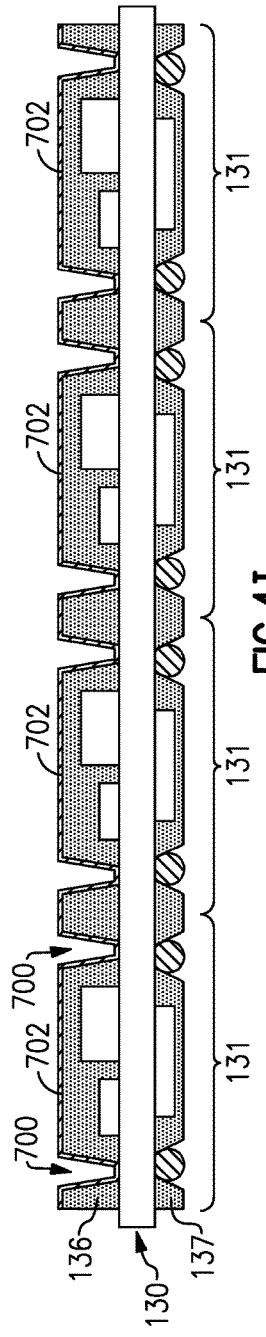
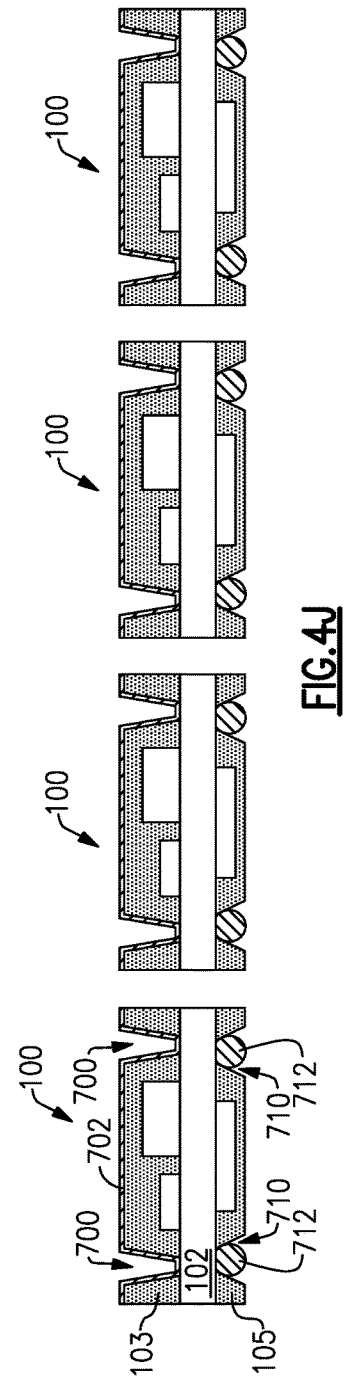
FIG. 4H
FIG. 4I
FIG. 4J

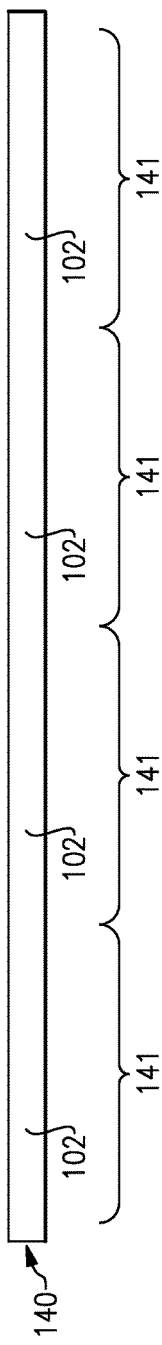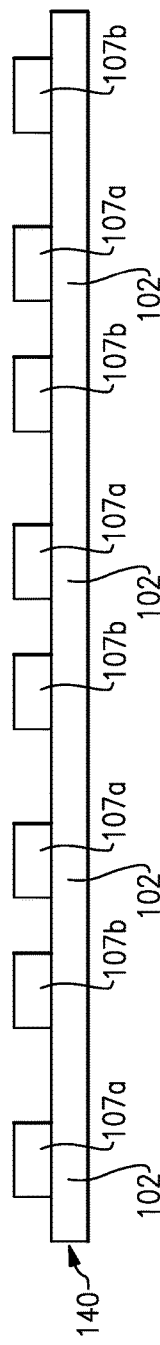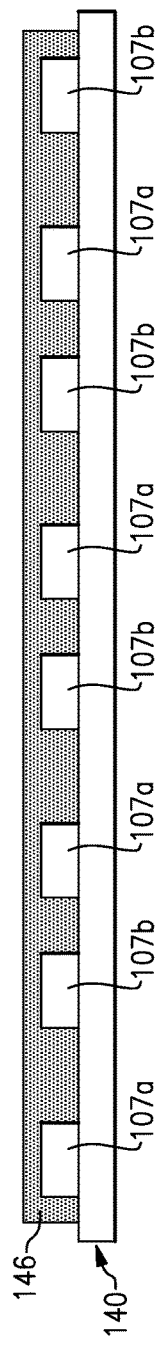

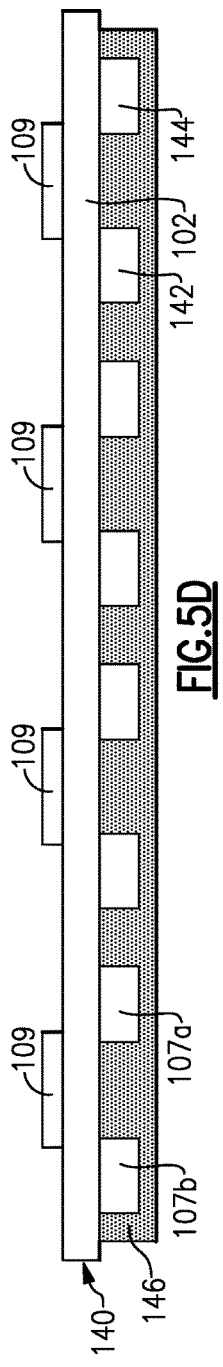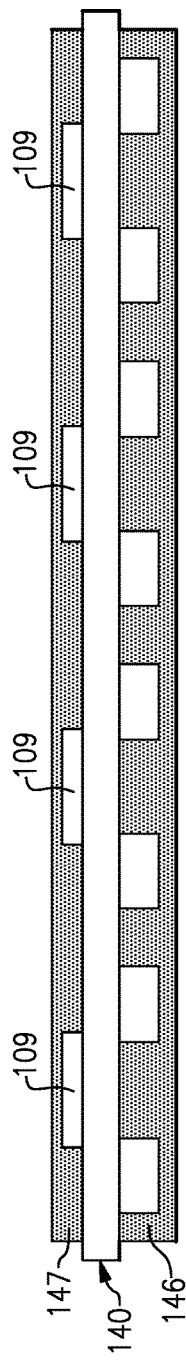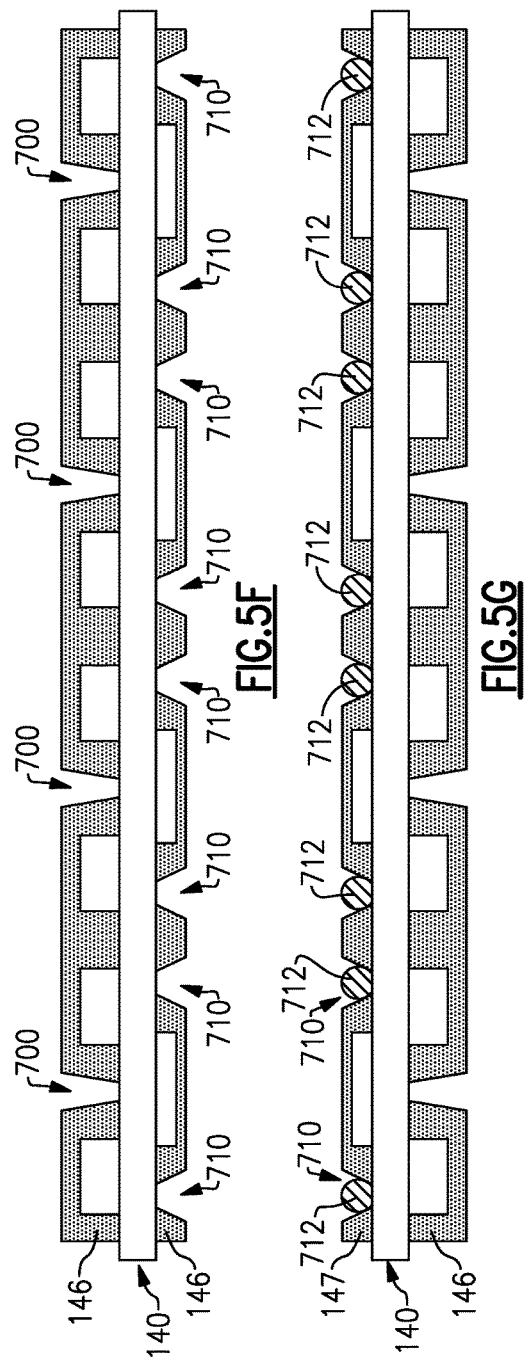

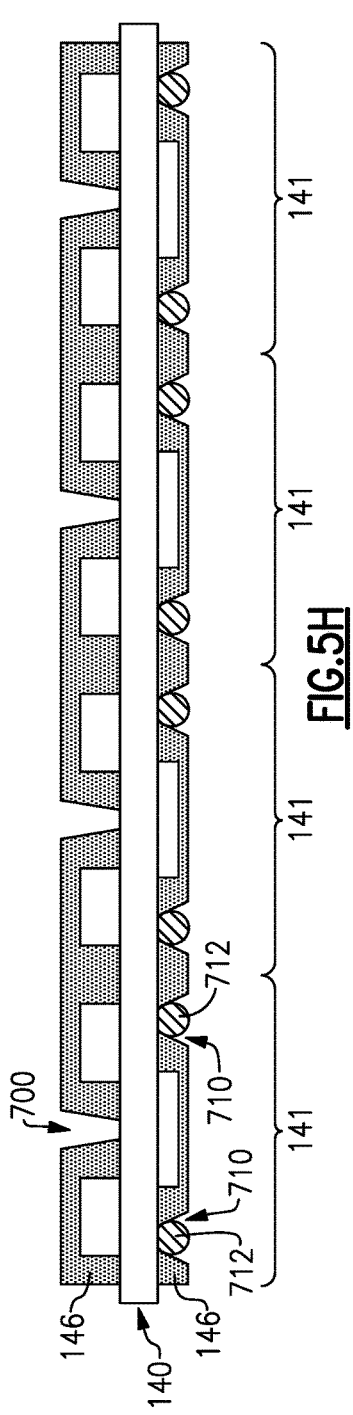
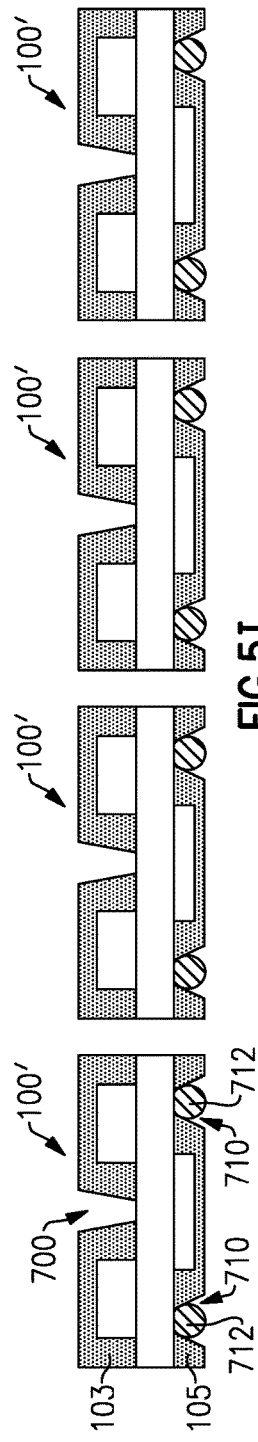
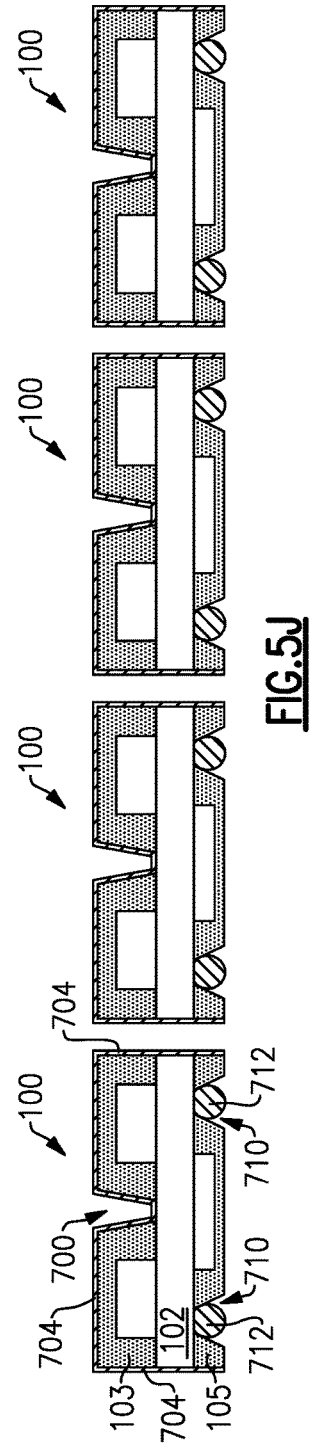

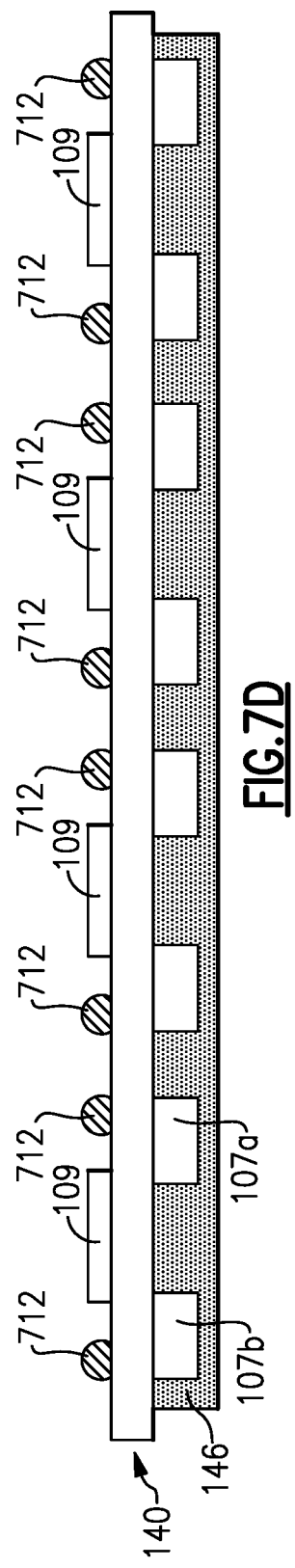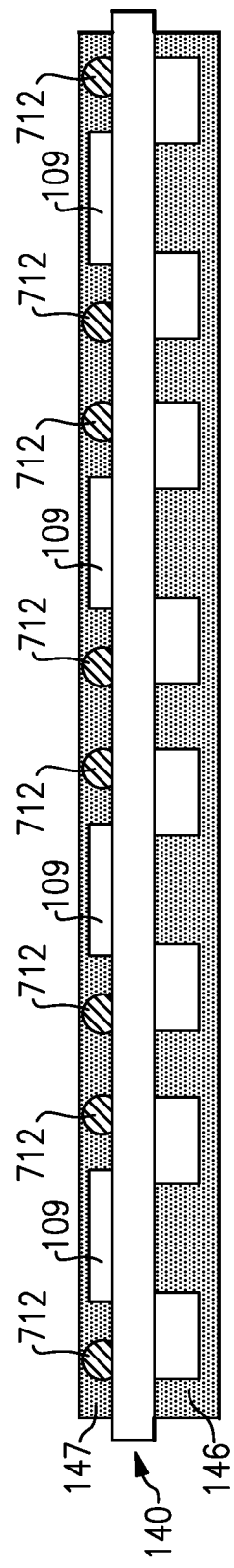

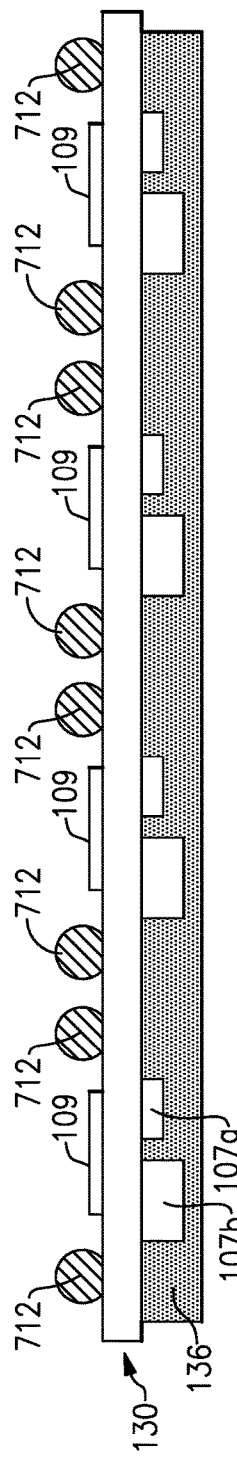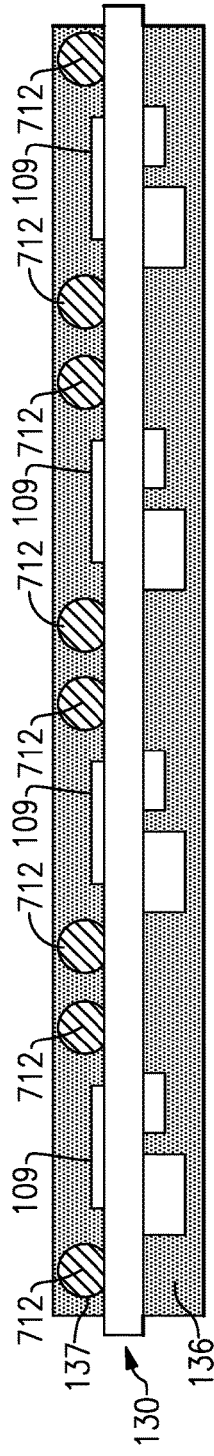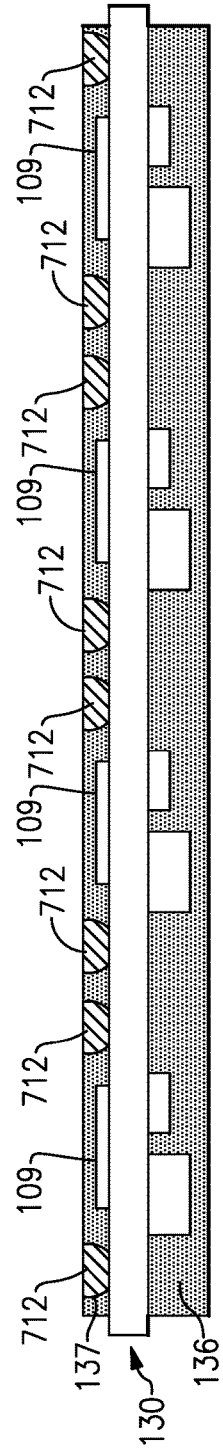

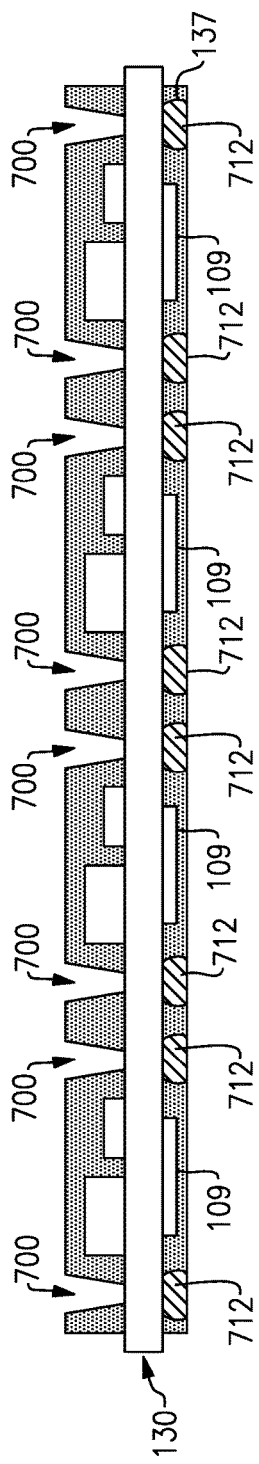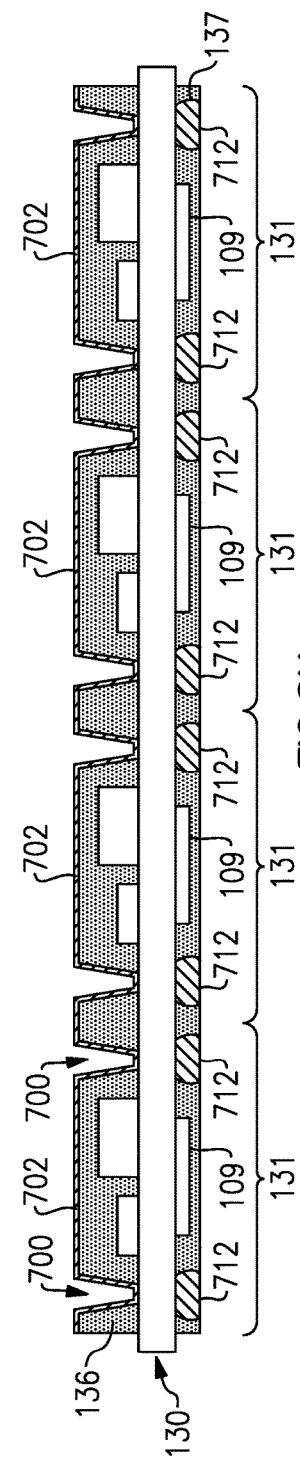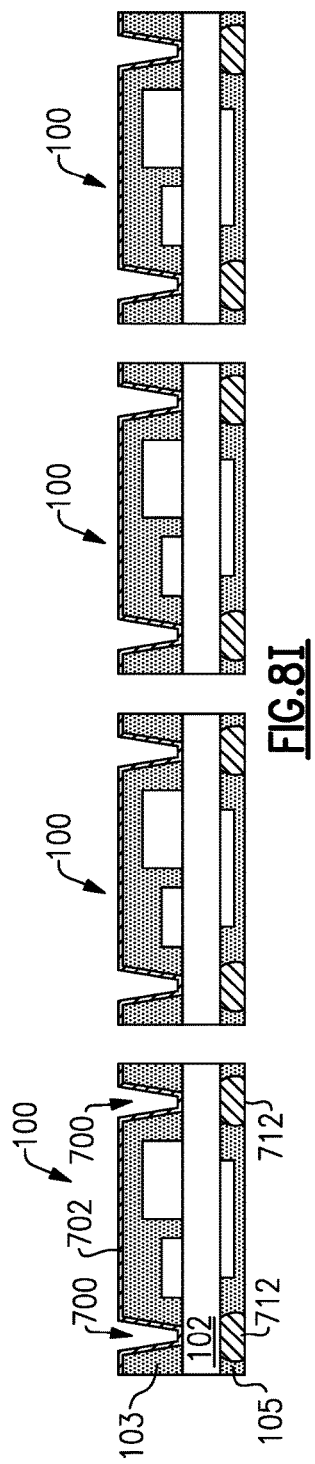

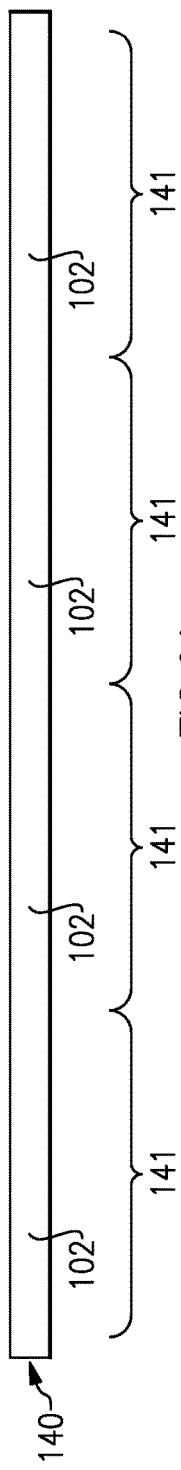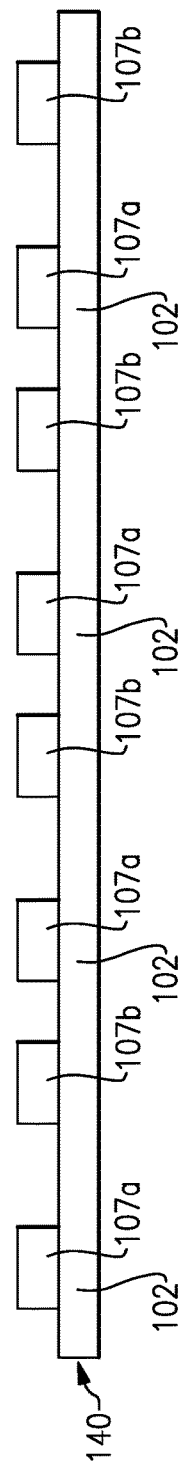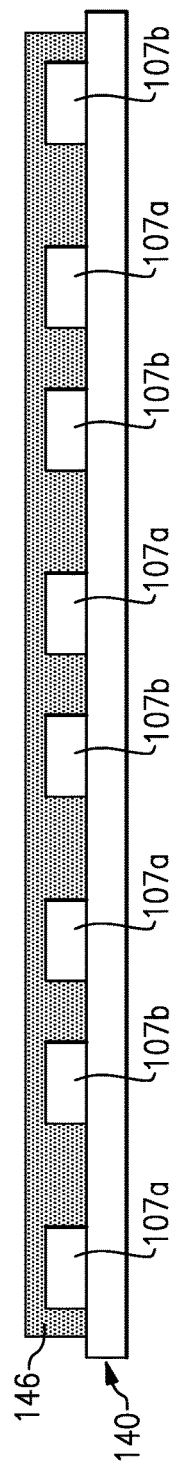

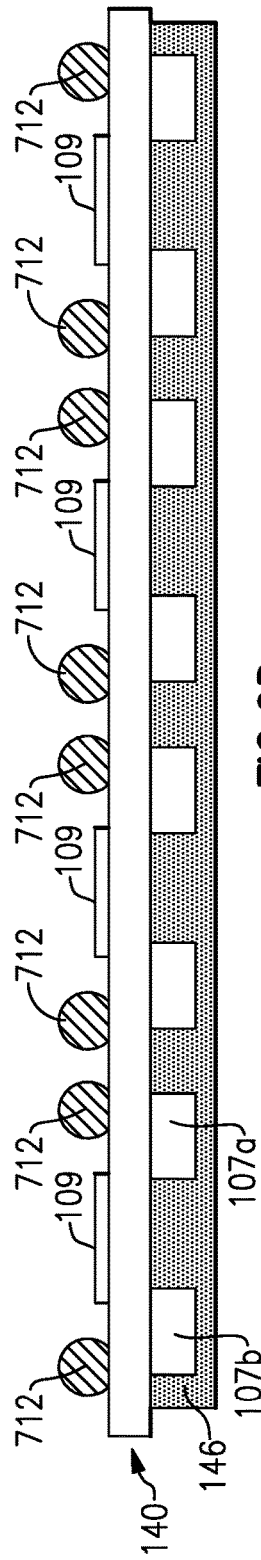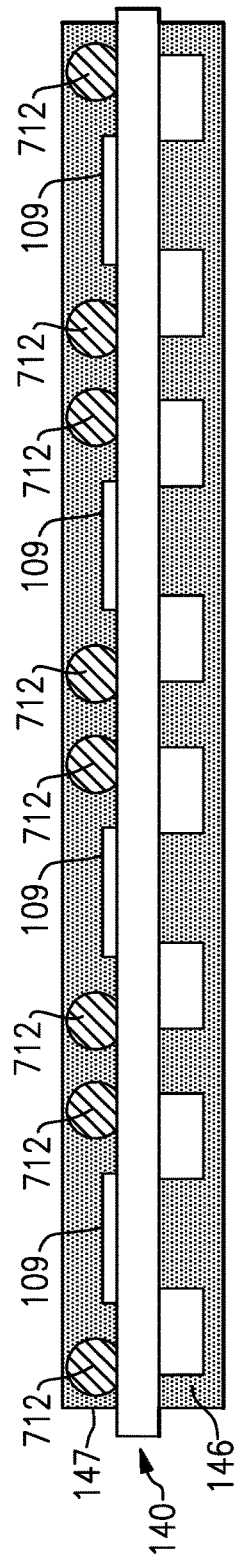

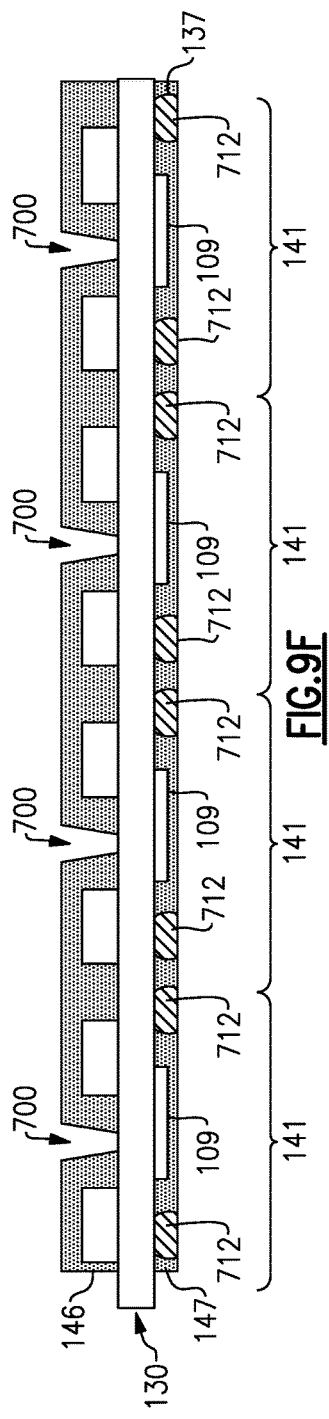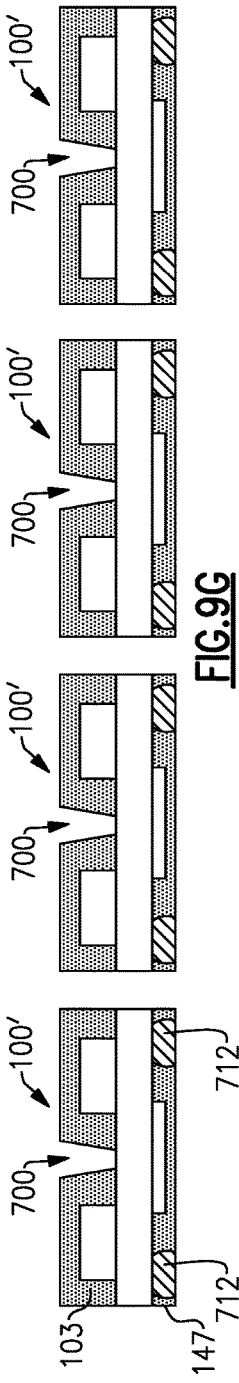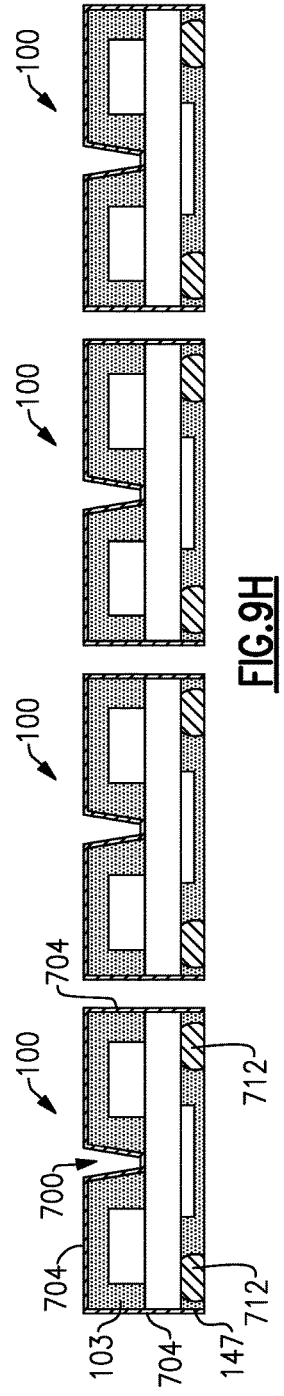

THROUGH-MOLD OPENINGS FOR DUAL-SIDED PACKAGED MODULES WITH BALL GRID ARRAYS

CROSS-REFERENCE TO RELATED APPLICATION(S)

This application claims priority to U.S. Provisional Application No. 62/534,052 filed Jul. 18, 2017, entitled THROUGH-MOLD OPENINGS FOR DUAL-SIDED PACKAGED MODULES WITH BALL GRID ARRAYS. The contents of the above-referenced application(s) are hereby expressly incorporated by reference in their entireties for all purposes. This application incorporates by reference in its entirety, U.S. application Ser. No. 15/705,230 filed Sep. 14, 2017, entitled THROUGH-MOLD FEATURES FOR SHIELDING APPLICATIONS. This application incorporates by reference in its entirety, U.S. application Ser. No. 15/724,722 filed Oct. 4, 2017, entitled DUAL-SIDED RADIO-FREQUENCY PACKAGE WITH OVERMOLD STRUCTURE.

BACKGROUND

Field

The present disclosure generally relates to packaging of circuit devices.

Description of the Related Art

The present disclosure relates to fabrication of packaged electronic modules such as radio-frequency (RF) modules. In radio-frequency (RF) applications, RF circuits and related devices can be implemented in a packaged module. Such a packaged module can then be mounted on a circuit board such as a phone board.

SUMMARY

In accordance with some implementations, the present disclosure relates to a dual-sided module comprising a packaging substrate having an upper side, a lower side, and a ground plane. The dual-sided module further comprises a radio-frequency circuit assembly implemented on both of the upper and lower sides of the packaging substrate, and an upper overmold implemented on the upper side of the packaging substrate to cover an upper portion of the radio-frequency circuit assembly, the upper overmold defining one or more openings dimensioned to expose one or more contact pads on the upper side of the packaging substrate, the one or more contact pads in electrical connection with the ground plane. The dual-sided module may further include a conductive layer configured to cover an upper surface and the one or more openings of the upper overmold to be in electrical contact with the ground plane to thereby provide shielding for a region on the upper side of the packaging substrate, a lower overmold implemented on the lower side of the packaging substrate to cover a lower portion of the radio-frequency circuit assembly, the lower overmold defining a plurality of openings and a contact feature implemented within each of the openings of the lower overmold to be in contact with the packaging substrate, such that the resulting contact features allow the dual-sided module to be mounted on a circuit board.

In some embodiments, the one or more openings defined by the upper overmold includes one or more through-mold vias. In some embodiments, the one or more through-mold vias are configured to provide shielding between the region on the upper side of the packaging substrate and another location.

In some embodiments, the other location is a location that is external to the dual-sided module. In some embodiments, the other location is a location that is within the dual-sided module to thereby provide intra-module shielding.

In some embodiments, the conductive layer is further configured to cover some or all of side walls defined by the dual-sided module. In some embodiments, the packaging substrate further includes a contact feature electrically connected to the ground plane and exposed on each of the side walls, such that the conductive layer on the corresponding side wall is further electrically connected to the ground plane through the contact feature. In some embodiments, the conductive layer is implemented as a conformal coating of conductive material.

In some embodiments, each of the one or more openings defined by the lower overmold includes a through-mold opening dimensioned to receive the corresponding contact feature. In some embodiments, the contact feature includes a solder ball. In some embodiments, the through-mold opening includes a side sectional profile having a maximum width at a lower surface of the lower overmold.

In some embodiments, the solder ball is dimensioned and positioned within the through-mold opening such that a lower portion of the solder ball is a level that is approximately the same as the lower surface of the lower overmold. In some embodiments, the solder ball and the corresponding through-mold opening define a ring-shaped space around lower portion of the solder ball to facilitate the mounting of the dual-sided module on the circuit board. In some embodiments, the contact features are configured as a ball grid array.

In some embodiments, each opening defined by the lower overmold is implemented by the lower overmold being formed around the corresponding ball of the ball grid array. In some embodiments, the opening defined by the lower overmold includes a side sectional profile having a maximum width at a lower surface of the lower overmold.

In some embodiments, the lower portion of the radio-frequency circuit includes a semiconductor die having a radio-frequency circuit. In some embodiments, the lower overmold is dimensioned to substantially encapsulate the semiconductor die. In some embodiments, the plurality of openings of the lower overmold substantially surrounds the semiconductor die. In some embodiments, the contact features associated with the plurality of openings of the lower overmold are configured and arranged in a pattern as a ball grid array or a land grid array.

In some embodiments, the pattern of the contact features is dimensioned such that some or all of a lateral region occupied by the semiconductor die displaces grounding connections of the dual-sided module.

The present disclosure also relates to a method for manufacturing a dual-sided module. The method comprises providing or forming a packaging substrate having an upper side, a lower side, and a ground plane. The method includes implementing a radio-frequency circuit assembly on both of the upper and lower sides of the packaging substrate, forming an upper overmold on the upper side of the packaging substrate to cover an upper portion of the radio-frequency circuit assembly and forming one or more openings through the upper overmold to expose one or more contact pads on the upper side of the packaging substrate, the one or more contact pads in electrical connection with the ground plane.

The method may further include covering an upper surface and the one or more openings of the upper overmold with a conductive layer to be in electrical contact with the ground plane to thereby provide shielding for a region on the upper side of the packaging substrate, forming a lower overmold on the lower side of the packaging substrate to cover a lower portion of the radio-frequency circuit assembly, forming a plurality of openings through the lower overmold to expose corresponding contact pads on the lower side of the packaging substrate, and implementing a contact feature within each of the openings of the lower overmold to be in contact with the corresponding contact pad, such that the resulting contact features allow the dual-sided module to be mounted on a circuit board.

The present disclosure also relates to a method for manufacturing a dual-sided module. The method comprises providing or forming a packaging substrate having an upper side, a lower side, and a ground plane. The method includes implementing a radio-frequency circuit assembly on both of the upper and lower sides of the packaging substrate, forming an upper overmold on the upper side of the packaging substrate to cover an upper portion of the radio-frequency circuit assembly and forming one or more openings through the upper overmold to expose one or more contact pads on the upper side of the packaging substrate, the one or more contact pads in electrical connection with the ground plane. The method may further include covering an upper surface and the one or more openings of the upper overmold with a conductive layer to be in electrical contact with the ground plane to thereby provide shielding for a region on the upper side of the packaging substrate, implementing a plurality of contact features on the lower side of the packaging substrate, forming a lower overmold on the lower side of the packaging substrate to cover a lower portion of the radio-frequency circuit assembly and some or all of each of the contact features on the lower side of the packaging substrate, and processing the lower overmold to expose the contact features to allow the dual-sided module to be mounted on a circuit board.

The present disclosure also relates to a method for manufacturing a dual-sided module. The method comprises providing or forming a panel having an upper side and a lower side, each unit including a packaging substrate having a ground plane, and implementing a radio-frequency circuit assembly on both of the upper and lower sides of the packaging substrate of each unit. The method includes forming an upper overmold on the upper side of the panel to cover an upper portion of the radio-frequency circuit assembly of each unit, forming one or more openings through the upper overmold to expose one or more contact pads on the upper side of the packaging substrate of each unit, the one or more contact pads in electrical connection with the ground plane, and forming a lower overmold on the lower side of the panel to cover a lower portion of the radio-frequency circuit assembly of each unit. The method may further include forming a plurality of openings through the lower overmold to expose corresponding contact pads on the lower side of the packaging substrate of each unit and implementing a contact feature within each of the openings of the lower overmold to be in contact with the corresponding contact pad to thereby result in an panel assembly.

In some embodiments, the method further comprises singulating the panel assembly to result in a plurality of singulated units. In some embodiments, the method further comprises, prior to the singulating, covering an upper surface and the openings of the upper overmold with a conductive layer to be in electrical contact with the ground plane of each packaging substrate to thereby provide shielding for a region on the upper side of the packaging substrate.

In some embodiments, the method further comprises, after the singulating, covering an upper surface and the openings of a singulated upper overmold and side walls of each singulated unit with a conductive layer to be in electrical contact with the ground plane of each packaging substrate to thereby provide conformal shielding for singulated unit. In some embodiments, the covering is performed for the plurality of the singulated units together in an array.

The present disclosure also relates to a method for manufacturing a plurality of dual-sided modules. The method comprises providing or forming a panel having an upper side and a lower side, each unit including a packaging substrate having a ground plane, implementing a radio-frequency circuit assembly on both of the upper and lower sides of the packaging substrate of each unit and forming an upper overmold on the upper side of the panel to cover an upper portion of the radio-frequency circuit assembly of each unit. The method may further include forming one or more openings through the upper overmold to expose one or more contact pads on the upper side of the packaging substrate of each unit, the one or more contact pads in electrical connection with the ground plane and implementing a plurality of contact features on the lower side of each unit. The method may further include forming a lower overmold on the lower side of the panel to cover a lower portion of the radio-frequency circuit assembly and some or all of each of the contact features on the lower side of each unit, and processing the lower overmold to expose the contact features.

In some embodiments, the method further comprises singulating the panel assembly to result in a plurality of singulated units. In some embodiments, the method further comprises, prior to the singulating, covering an upper surface and the openings of the upper overmold with a conductive layer to be in electrical contact with the ground plane of each packaging substrate to thereby provide shielding for a region on the upper side of the packaging substrate.

In some embodiments, the method further comprises, after the singulating, covering an upper surface and the openings of a singulated upper overmold and side walls of each singulated unit with a conductive layer to be in electrical contact with the ground plane of each packaging substrate to thereby provide conformal shielding for singulated unit. In some embodiments, the covering is performed for the plurality of the singulated units together in an array.

The present disclosure also relates to a wireless device comprising a circuit board configured to receive a plurality of components, a transceiver implemented on the circuit board and configured to process radio-frequency signals, and a dual-sided module implemented on the circuit board and in communication with the transceiver. The dual-sided module may include a packaging substrate having an upper side, a lower side, and a ground plane, a radio-frequency circuit assembly implemented on both of the upper and lower sides of the packaging substrate, an upper overmold implemented on the upper side of the packaging substrate to cover an upper portion of the radio-frequency circuit assembly, the upper overmold defining one or more openings dimensioned to expose one or more contact pads on the upper side of the packaging substrate, and the one or more contact pads in electrical connection with the ground plane. The dual-sided module may include a conductive layer configured to cover an upper surface and the one or more openings of the upper overmold to be in electrical contact with the ground plane to thereby provide shielding for a region on the upper side of the packaging substrate, a lower overmold implemented on the lower side of the packaging substrate to cover a lower portion of the radio-frequency circuit assembly, the lower overmold defining a plurality of openings, and a contact feature implemented within each of the openings of the lower overmold to allow the dual-sided module to be mounted on a circuit board.

BRIEF DESCRIPTION OF THE DRAWINGS

FIG. 4D illustrates a plurality of components mounted on the underside of a packaging substrate panel, in accordance with some implementations.

FIG. 4E illustrates a second overmold structure formed over a packaging substrate panel, in accordance with some implementations.

FIG. 4F illustrates a first overmold structure having one or more openings, in accordance with some implementations.

FIG. 4G illustrates a packaging substrate panel with a solder ball provided into each of the openings formed on the second overmold structure, in accordance with some implementations.

FIG. 4H illustrates an assembly oriented and prepared to receive a conductive layer on the first overmold structure, in accordance with some implementations.

FIG. 4I illustrates a packaging substrate panel with a conductive layer formed in a conformal manner so as to cover the upper surface of an overmold, in accordance with some implementations.

FIG. 4J illustrates an assembly of packaging substrates singulated into a plurality of dual-sided shielded RF modules, in accordance with some implementations.

FIG. 5A illustrates a packaging substrate panel having a plurality of units, in accordance with some implementations.

FIG. 5B illustrates a plurality of components mounted on the upper side of a packaging substrate, in accordance with some implementations.

FIG. 5C illustrates a first overmold structure formed over a packaging substrate panel, in accordance with some implementations.

FIG. 5D illustrates a plurality of components mounted on the underside of a packaging substrate panel, in accordance with some implementations.

FIG. 5E illustrates a second overmold structure formed over a packaging substrate panel, in accordance with some implementations.

FIG. 5F illustrates a first overmold structure having one or more openings, in accordance with some implementations.

FIG. 5G illustrates a packaging substrate panel with a solder ball provided into each of the openings formed on the second overmold structure, in accordance with some implementations.

FIG. 5H illustrates an assembly oriented and prepared to receive a conductive layer on the first overmold structure, in accordance with some implementations.

FIG. 5I illustrates a plurality of singulated, unshielded modules, in accordance with some implementations.

FIG. 5J illustrates a plurality of dual-sided shielded RF modules, in accordance with some implementations.

FIG. 7D illustrates a plurality of components mounted on the underside of a packaging substrate panel, in accordance with some implementations.

FIG. 7E illustrates a second overmold structure formed over a packaging substrate panel, in accordance with some implementations.

FIG. 8D illustrates a plurality of components mounted on the underside of a packaging substrate panel oriented with the first overmold structure flipped downward, in accordance with some implementations.

FIG. 8E illustrates a second overmold structure formed over a packaging substrate panel, in accordance with some implementations.

FIG. 8F illustrates at least a portion of the second overmold structure and one or more solder balls removed, in accordance with some implementations.

FIG. 8G illustrates a packaging substrate panel with a first overmold structure having one or more openings, in accordance with some implementations.

FIG. 8H illustrates an assembly oriented and prepared to receive a conductive layer on the first overmold structure, in accordance with some implementations.

FIG. 8I illustrates a plurality of dual-sided shielded RF modules, in accordance with some implementations.

FIG. 9A illustrates a packaging substrate panel, in accordance with some implementations.

FIG. 9B illustrates a plurality of components mounted on the upper side of a packaging substrate, in accordance with some implementations.

FIG. 9C illustrates a first overmold structure formed over a packaging substrate panel, in accordance with some implementations.

FIG. 9D illustrates a plurality of components mounted on the underside of a packaging substrate panel oriented with the first overmold structure flipped downward, in accordance with some implementations.

FIG. 9E illustrates a second overmold structure formed over a packaging substrate panel, in accordance with some implementations.

FIG. 9F illustrates a packaging substrate panel with a first overmold structure having one or more openings and at least a portion of the second overmold structure and one or more solder balls removed, in accordance with some implementations.

FIG. 9G illustrates a plurality of singulated, unshielded modules, in accordance with some implementations.

FIG. 9H illustrates a plurality of dual-sided shielded RF modules, in accordance with some implementations.

DESCRIPTION

The headings provided herein, if any, are for convenience only and do not necessarily affect the scope or meaning of the claimed invention.

Figure 1:
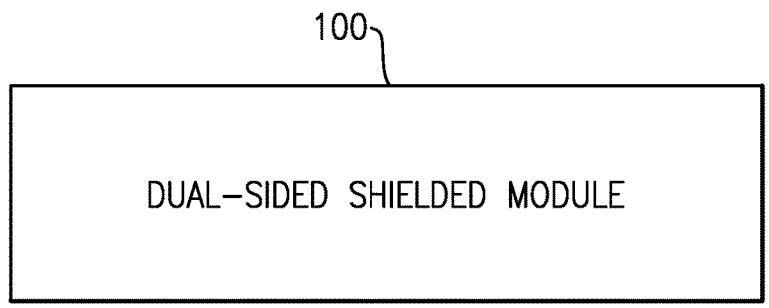
FIG. 1 illustrates a dual-sided packaged radio-frequency module having a shielding functionality, in accordance with some implementations.

FIG. 1 depicts a dual-sided packaged radio-frequency (RF) module 100 having a shielding functionality. As described herein, such a packaged module can include one or more openings implemented through an overmold structure on a first side of the module and configured to facilitate such shielding functionality. As also described herein, such a packaged module can include a plurality of openings on a second side of the module and configured to facilitate structures for providing electrical contacts and/or mounting functionality for the module. Various examples related both sides of the module are described herein in greater detail.

For the purpose of description, a first side of a dual-sided module can be an upper side when the module is mounted on a circuit board such as a phone board. Accordingly, a second side of the dual-sided module can be a lower side or underside when in such an orientation. It will be understood that first and second sides can also be lower and upper sides, respectively, when in a mounted orientation.

Also for the purpose of description, various examples are described in the context of RF applications. However, it will be understood that one or more features of the present disclosure can also be implemented in non-RF packaging applications.

Figure 2:
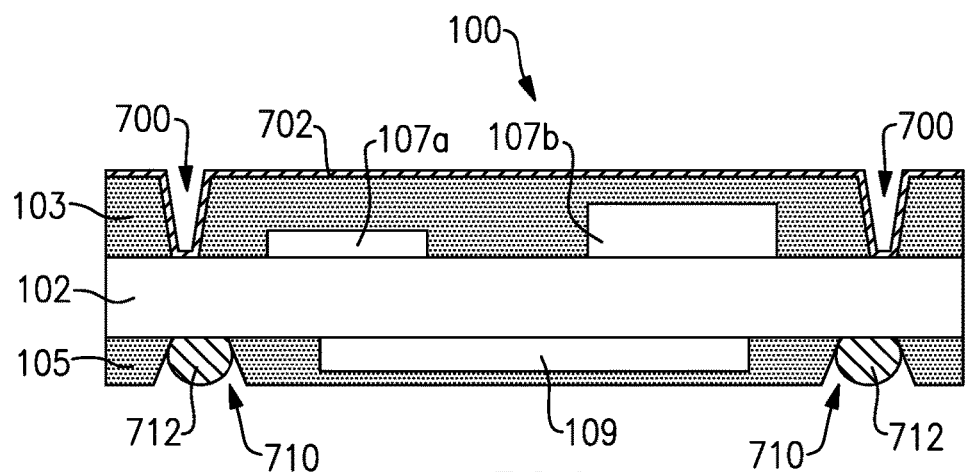
FIG. 2 illustrates a dual-sided RF module having a packaging substrate configured to receive one or more components on its first side, and to receive one or more components on its second side, in accordance with some implementations.
Figure 3:
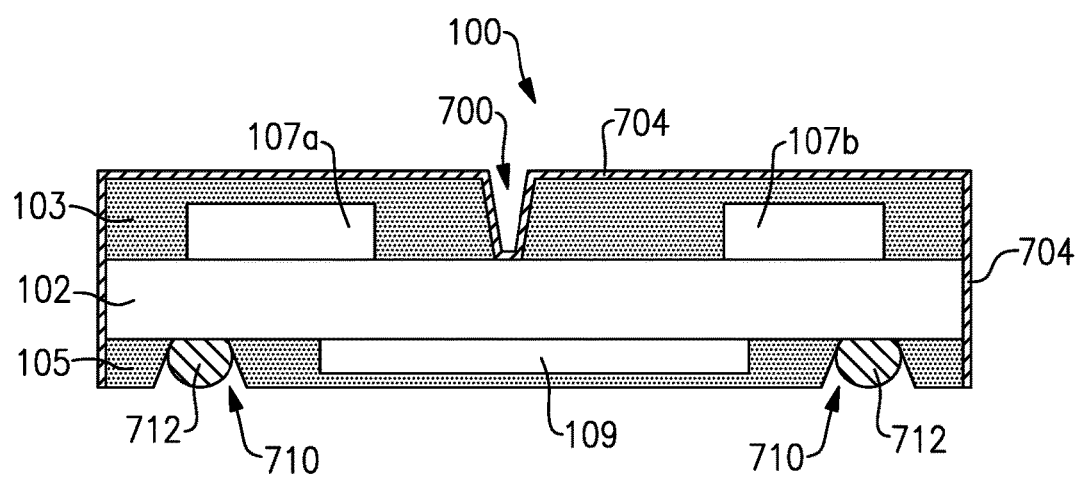
FIG. 3 illustrates a dual-sided RF module with a packaging substrate configured to receive one or more components on its first side, and to receive one or more components on its second side, in accordance with some implementations.

FIGS. 2 and 3 show non-limiting examples of a dual-sided RF module 100 having one or more features as described herein. In the example of FIG. 2, a dual-sided RF module 100 can include a packaging substrate 102 configured to receive one or more components on its first side (e.g., upper side), and to receive one or more components on its second side (e.g., underside). For the purpose of description, it will be understood that the packaging substrate 102 (e.g., a laminate substrate) includes various conductive features to facilitate such components on its first and second sides. It will also be understood the packaging substrate 102 also includes one or more ground planes to facilitate the module's shielding functionality.

In FIG. 2, shielding functionality of the module 100 is shown to be facilitated by a conductive layer 702 implemented on an upper surface of an overmold structure 103 that is shown to encapsulate example components 107a, 107b mounted on the packaging substrate 102. Such components can include, for example, a semiconductor die having an RF circuit, a surface-mount device (SMD) such as a passive component, etc.

In FIG. 2, an electrical connection between the conductive layer 702 and a portion of the packaging substrate 102 is shown to be facilitated by a plurality of openings such as through-mold vias (TMVs) 700. For example, the conductive layer 702 can extend into each the TMVs 700 so as to form an electrical connection with, for example, a contact pad on the upper surface of the packaging substrate 102. Such a contact pad can be electrically connected to a ground plane within the packaging substrate 102, thereby providing shielding functionality for the module 100.

In the example of FIG. 2, the TMVs 700 having associated conductive features (e.g., extension of the conductive layer 702) can be arranged to provide, for example, shielding functionality between an internal region of the module (e.g. an upper internal region where the components 107a, 107b are located) and a region external to the module 100. In some embodiments, such TMVs can be arranged to form a partial or full perimeter around the internal region.

It will be understood that in the example of FIG. 2, the module 100 can include one or more TMVs 700 (with or without the foregoing perimeter arrangement of TMVs) providing electrical connection similar to the above example. Such one or more TMVs can be arranged to provide shielding between first and second regions of the module (also referred to as intra-module shielding).

Additional details concerning such TMVs of FIG. 2 facilitating shielding functionality, as well as examples of variations, are disclosed in Appendix A.

In the example of FIG. 2, the conductive layer 702 generally does not cover the side walls of the module 100. As described herein, such a feature can allow more process steps to be performed while an array of such modules are together in, for example, a panel format.

In the example of FIG. 3, a dual-sided RF module 100 can include a packaging substrate 102 configured to receive one or more components on its first side (e.g., upper side), and to receive one or more components on its second side (e.g., underside). For the purpose of description, it will be understood that the packaging substrate 102 (e.g., a laminate substrate) includes various conductive features to facilitate such components on its first and second sides. It will also be understood the packaging substrate 102 also includes one or more ground planes to facilitate the module's shielding functionality.

In FIG. 3, shielding functionality of the module 100 is shown to be facilitated by a conductive layer 704 implemented on an upper surface of an overmold structure 103 that is shown to encapsulate example components 107a, 107b mounted on the packaging substrate 102. Such components can include, for example, a semiconductor die having an RF circuit, a surface-mount device (SMD) such as a passive component, etc. The conductive layer 704 is shown to also cover the side walls of the module 100. In some embodiments, such a conductive layer can be implemented as, for example, a conformal layer of conductive material.

In FIG. 3, an electrical connection between the conductive layer 704 and a portion of the packaging substrate 102 is shown to be facilitated by one or more openings such as through-mold vias (TMVs) 700. For example, the conductive layer 704 can extend into each the TMVs 700 so as to form an electrical connection with, for example, a contact pad on the upper surface of the packaging substrate 102. Such a contact pad can be electrically connected to a ground plane within the packaging substrate 102, thereby providing shielding functionality for the module 100.

In FIG. 3, an electrical connection between the conductive layer 704 and the ground plane can also be made through a conductive feature exposed on each side wall so as to form an electrical contact with the side-wall portion of the conductive layer 704. Such a conductive feature can be in electrical connection with the ground plane.

In the example of FIG. 3, the conformal conductive layer 704 in electrical connection with the ground plane can provide, for example, shielding functionality between an internal region of the module (e.g. a region within the side walls) and a region external to the module 100. Further, the one or more TMVs 700 providing electrical connection between the conductive layer 704 and the ground plane, can provide shielding between first and second regions of the module (also referred to as intra-module shielding). For example, the first region can be a region where the first component 107a is located, and the second region can be a region where the second component 107b is located.

Additional details concerning such TMV(s) of FIG. 3 being utilized with a conformal conductive layer, as well as examples of variations, are disclosed in Appendix A.

In each of the examples of FIGS. 2 and 3, the underside of the packaging substrate 102 can include one or more components mounted thereto. For example, a component 109 such as a semiconductor die having an RF circuit can be mounted on the underside of the packaging substrate 102.

In FIGS. 2 and 3, an overmold structure 105 is shown to be formed to encapsulate the component 109. Such an overmold can include a plurality of openings 710 that extend between the underside of the packaging substrate 102 and the lower surface of the overmold 105. In some embodiments, such openings can facilitate implementation of features that provide mounting and/or electrical connection functionalities for the module 100.

In the examples shown in FIGS. 2 and 3, the openings 710 are shown to be formed through the overmold 105, and features such as solder balls 712 are shown to be formed within such openings. Such solder balls can be in electrical contact with the underside of the packaging substrate 102 to provide, for example, grounding and/or non-grounding connections for the module 100. Such solder balls can also facilitate mounting of the module 100 on a circuit board such as a phone board. Such solder balls may also provide for electrical (e.g., conductive) connections between the module 100, components of the module 100, and/or a circuit board. The solder balls (e.g., solder balls 712) described herein may be referred to as contact features or through-mold connections. Other examples of through-mold connections and/or contact features include, but are not limited to, solder balls, pillars, columns, posts, pedestals, etc.

Additional details concerning such underside configuration of FIGS. 2 and 3, as well as examples of variations, are disclosed in Appendix B.

Figure 4A:
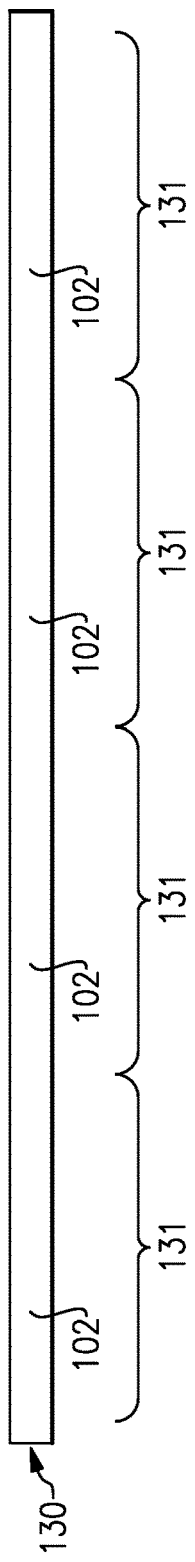
FIG. 4A illustrates a packaging substrate panel having a plurality of units, in accordance with some implementations.

In some embodiments, a plurality of shielded RF modules having one or more features as described herein can be fabricated while in a panel format for some or all of various process steps. FIGS. 4A-4T show various example stages of a fabrication process that can be utilized to manufacture a plurality of shielded RF modules that do not have conductive side-wall layers. FIGS. 5A-5T show various example stages of a fabrication process that can be utilized to manufacture a plurality of shielded RF modules that have conductive side walls.

FIG. 4A shows a panel 130 having a plurality of units 131, where each unit is configured to become a packaging substrate 102 once singulated. Each unit 131 can include one or more contact pads on its upper side, and it is assumed that each of such contact pad(s) is electrically connected to a ground plane within the packaging substrate 102. Each unit 131 can also include a plurality of contact pads on its underside, and it is assumed that each of such contact pads are configured to facilitate mounting of one or more components and/or to receive conductive features such as solder balls.

Figure 4B:
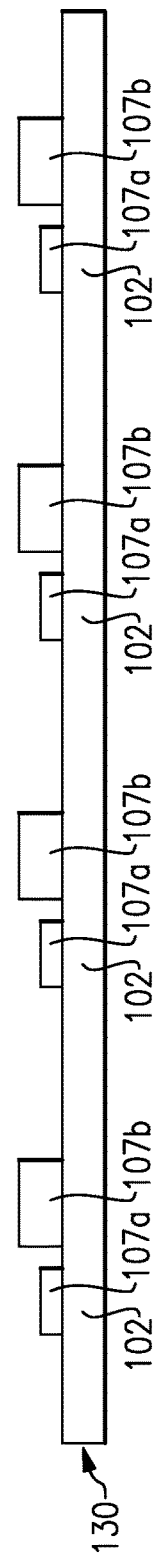
FIG. 4B illustrates a plurality of components mounted on the upper side of a packaging substrate, in accordance with some implementations.

FIG. 4B shows a plurality of components 107a, 107b mounted on the upper side of the packaging substrate 102 for each unit 131 of the panel 130. Such components can include, for example, one or more die having respective integrated circuit(s), one or more surface mount devices (SMDs) such as passive components, or some combination thereof. Such components can be parts of an RF circuit assembly.

Figure 4C:
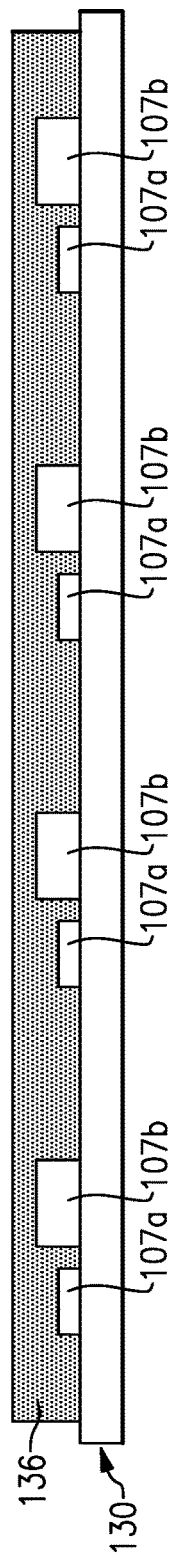
FIG. 4C illustrates a first overmold structure formed over a packaging substrate panel, in accordance with some implementations.

FIG. 4C shows that a first overmold structure 136 can be formed over the packaging substrate panel 130 so as to cover each set of one or more components 107a, 107b associated with the corresponding unit.

FIG. 4D shows a plurality of components 109 mounted on the underside of the packaging substrate panel 130. In the example shown, one component 109 is mounted on the underside of each unit 131 of the panel 130; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly.

FIG. 4E shows that a second overmold structure 137 can be formed over the packaging substrate panel 130 so as to cover each set of one or more components 109 associated with the corresponding unit.

FIG. 4F shows that one or more openings such as through-mold vias (TMVs) 700 can be formed through the first overmold structure 136. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed.

FIG. 4F also shows that a plurality of openings 710 can be formed through the second overmold structure 137. Such openings can be formed to expose at least some of the corresponding contact pads on the second side of the packaging substrate. In some embodiments, such openings can be formed by, for example, laser drilling configured to burn through the second overmold material and generally stop once the contact pads are exposed.

FIG. 4G shows that a solder ball 712 can be provided into each of the openings 710 formed on the second overmold structure 137. Such a solder ball can be provided so as to form a robust mechanical and electrical contact with the corresponding contact pad on the second side of the packaging substrate.

FIG. 4H shows the assembly of FIG. 4G oriented and prepared to receive a conductive layer on the first overmold structure 136.

FIG. 4I shows that a conductive layer 702 can be formed in a conformal manner so as to cover the upper surface of the overmold 136, the surface of each TMV 700, and the exposed portion of the corresponding contact pad. Accordingly, the conductive layer 702 on the upper surface of the overmold 136 can be electrically connected to the ground planes in the panel 130 through the respective conductive-material-coated TMVs. Such a conformal coating of conductive material can be applied by, for example, a deposition process such as a physical vapor deposition (PVD) process.

FIG. 4J shows that the assembly of FIG. 4I can be singulated into a plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module shielding and/or overall shielding for the module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

FIG. 5A shows a panel 140 having a plurality of units 141, where each unit is configured to become a packaging substrate 102 once singulated. Each unit 141 can include one or more contact pads on its upper side, and it is assumed that each of such contact pad(s) is electrically connected to a ground plane within the packaging substrate 102. Each unit 141 can also include a plurality of contact pads on its underside, and it is assumed that each of such contact pads are configured to facilitate mounting of one or more components and/or to receive conductive features such as solder balls.

FIG. 5B shows a plurality of components 107a, 107b mounted on the upper side of the packaging substrate 102 for each unit 141 of the panel 140. Such components can include, for example, one or more die having respective integrated circuit(s), one or more surface mount devices (SMDs) such as passive components, or some combination thereof. Such components can be parts of an RF circuit assembly.

FIG. 5C shows that a first overmold structure 146 can be formed over the packaging substrate panel 140 so as to cover each set of one or more components 107a, 107b associated with the corresponding unit.

FIG. 5D shows a plurality of components 109 mounted on the underside of the packaging substrate panel 140. In the example shown, one component 109 is mounted on the underside of each unit 141 of the panel 140; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly.

FIG. 5E shows that a second overmold structure 147 can be formed over the packaging substrate panel 140 so as to cover each set of one or more components 109 associated with the corresponding unit.

FIG. 5F shows that one or more openings such as through-mold vias (TMVs) 700 can be formed through the first overmold structure 146. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed.

FIG. 5F also shows that a plurality of openings 710 can be formed through the second overmold structure 147. Such openings can be formed to expose at least some of the corresponding contact pads on the second side of the packaging substrate. In some embodiments, such openings can be formed by, for example, laser drilling configured to burn through the second overmold material and generally stop once the contact pads are exposed.

FIG. 5G shows that a solder ball 712 can be provided into each of the openings 710 formed on the second overmold structure 147. Such a solder ball can be provided so as to form a robust mechanical and electrical contact with the corresponding contact pad on the second side of the packaging substrate.

FIG. 5H shows the assembly of FIG. 5G oriented and prepared to be singulated. It will be understood that the assembly of FIG. 5G can also be singulated in the orientation as shown in FIG. 5G.

FIG. 5I shows a plurality of unshielded modules 100' resulting from a singulation process. Such unshielded modules can be process further utilizing, for example, a stencil. Additional details concerning such stencil based processing of singulated devices are disclosed in Appendix A.

FIG. 5J shows that a conductive layer 704 can be formed in a conformal manner so as to cover the upper surface of the overmold 103 of each module, the surface of each TMV 700, the exposed portion of the corresponding contact pad, and the side walls of the module. Accordingly, the conductive layer 704 generally covering the upper side and side walls of the module can be electrically connected to the ground plane corresponding packaging substrate 102 through the respective conductive-material-coated TMVs and through conductive features exposed on the side walls. Such a conformal coating of conductive material can be applied by, for example, a deposition process such as a physical vapor deposition (PVD) process.

FIG. 5J shows the resulting plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

Figure 6A:
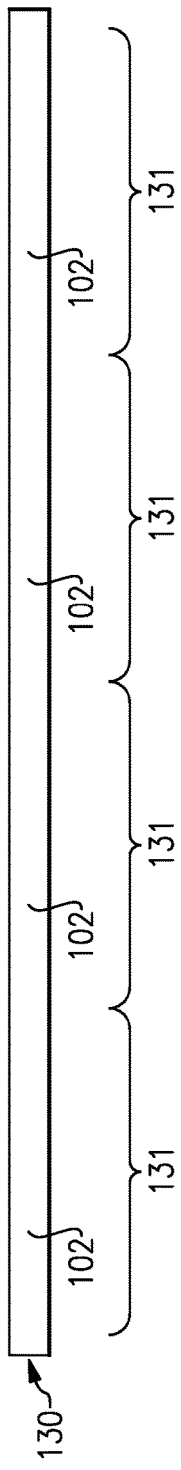
FIG. 6A illustrates a packaging substrate panel, in accordance with some implementations.

FIG. 6A shows a panel 130 having a plurality of units 131, where each unit is configured to become a packaging substrate 102 once singulated. Each unit 131 can include one or more contact pads on its upper side, and it is assumed that each of such contact pad(s) is electrically connected to a ground plane within the packaging substrate 102. Each unit 131 can also include a plurality of contact pads on its underside, and it is assumed that each of such contact pads are configured to facilitate mounting of one or more components and/or to receive conductive features such as solder balls.

Figure 6B:
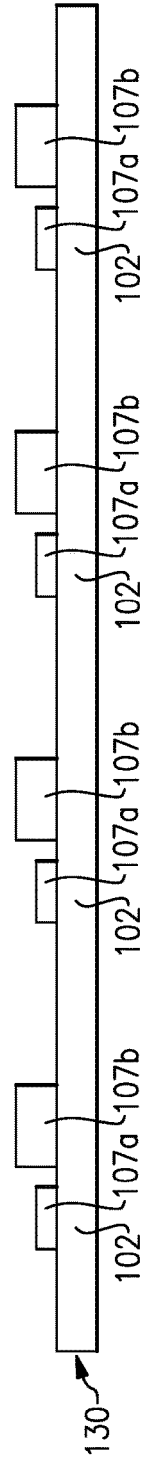
FIG. 6B illustrates a plurality of components mounted on the upper side of a packaging substrate, in accordance with some implementations.

FIG. 6B shows a plurality of components 107*a*, 107*b* mounted on the upper side of the packaging substrate 102 for each unit 131 of the panel 130. Such components can include, for example, one or more die having respective integrated circuit(s), one or more surface mount devices (SMDs) such as passive components, or some combination thereof. Such components can be parts of an RF circuit assembly.

Figure 6C:
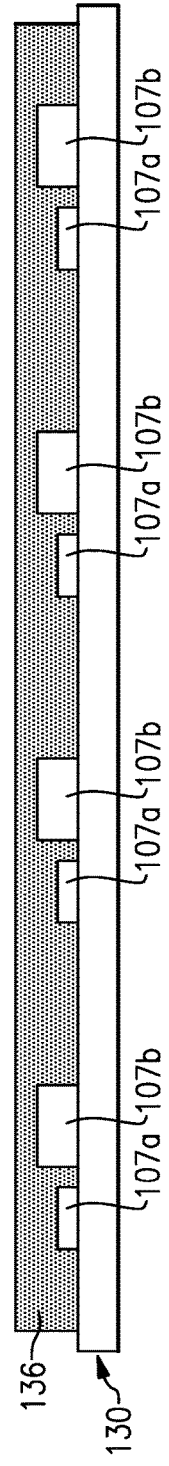
FIG. 6C illustrates a first overmold structure formed over a packaging substrate panel, in accordance with some implementations.

FIG. 6C shows that a first overmold structure 136 can be formed over the packaging substrate panel 130 so as to cover each set of one or more components 107*a*, 107*b* associated with the corresponding unit.

Figure 6D:
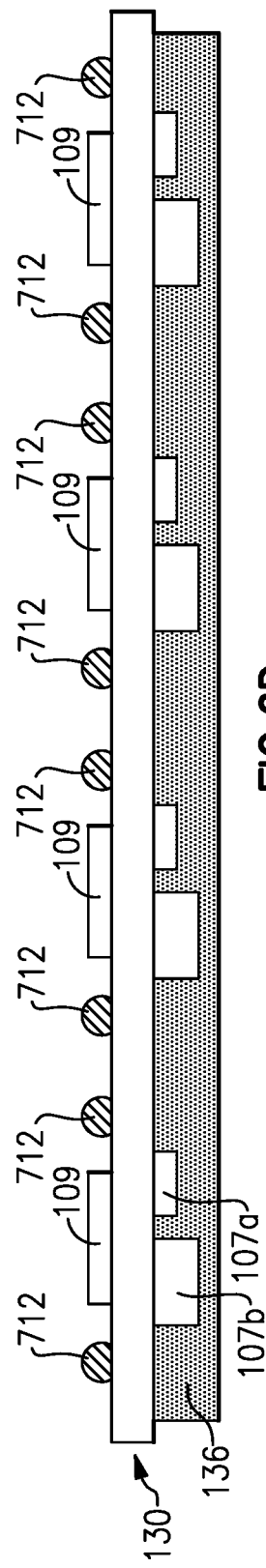
FIG. 6D illustrates a plurality of components mounted on the underside of a packaging substrate panel, in accordance with some implementations.

FIG. 6D shows a plurality of components 109 mounted on the underside of the packaging substrate panel 130. In the example shown, one component 109 is mounted on the underside of each unit 131 of the panel 130; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly. FIG. 6D also shows a plurality of solder balls 712 mounted, implemented, formed, etc., on the underside of the packaging substrate 130. The plurality of solder balls 712 may be formed on contact pads on the underside of the packaging substrate 130. Although solder balls 712 may be illustrated in FIG. 6D, one having ordinary skill in the art understands that other types of contact features, such as pillars, columns, posts, etc., may be used.

Figure 6E:
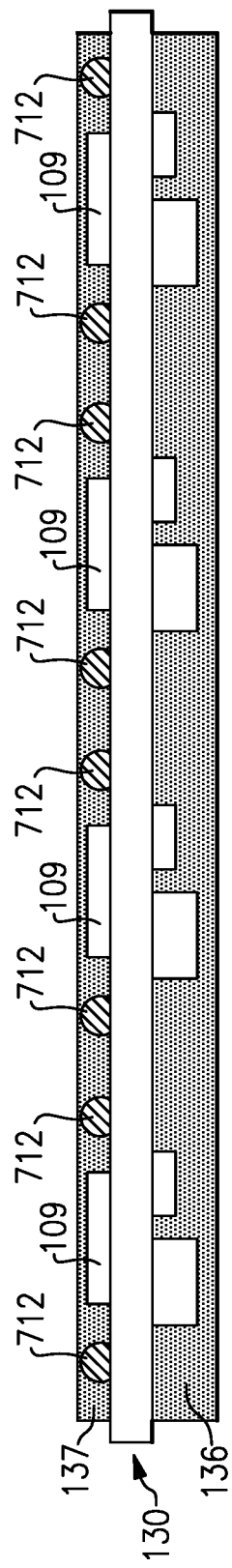
FIG. 6E illustrates a second overmold structure formed over a packaging substrate panel, in accordance with some implementations.

FIG. 6E shows that a second overmold structure 137 can be formed over the packaging substrate panel 130 so as to cover each set of one or more components 109 and the solder balls 712 associated with the corresponding unit. In some embodiments, the overmold structure 137 may completely cover the solder balls 712. For example, the overmold structure 137 may cover the solder balls 712 such that a thin layer (e.g., a film, a coating, a thin sheet, etc.) of the over mold material may remain deposited over the solder balls 106.

Figure 6F:
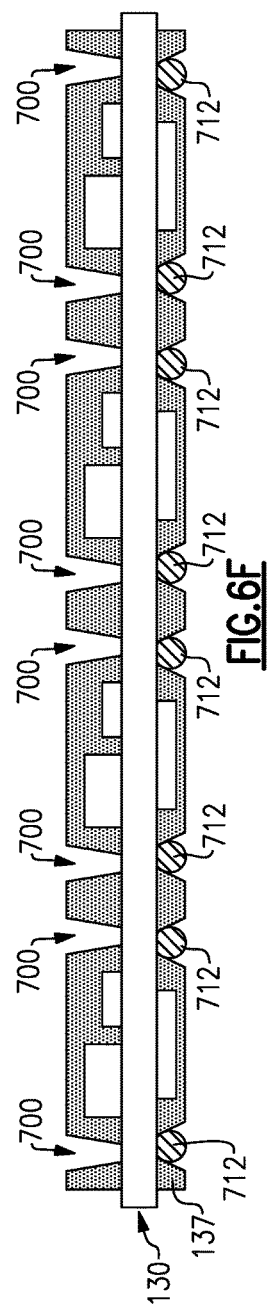
FIG. 6F illustrates a first overmold structure having one or more openings, in accordance with some implementations.
Figure 6G:
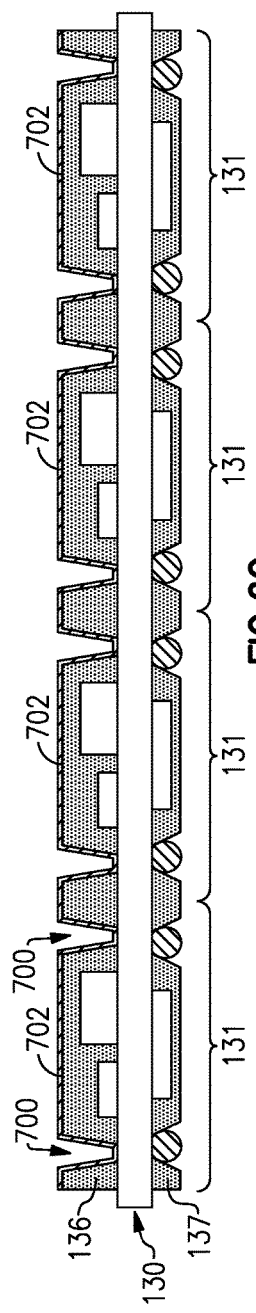
FIG. 6G illustrates a packaging substrate panel with a solder ball provided into each of the openings formed on the second overmold structure, in accordance with some implementations.

FIG. 6F shows that one or more openings such as through-mold vias (TMVs) 700 can be formed through the first overmold structure 136. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed. FIG. 6F also shows portions of the second overmold structure 137 may be removed. For example, a laser may be used to burn or melt portions of the second overmold structure 137 around the solder balls 712 to expose the solder balls through the second overmold structure 137. The assembly illustrated in FIG. 6F may be oriented and prepared to receive a conductive layer on the first overmold structure 136.

Figure 6H:
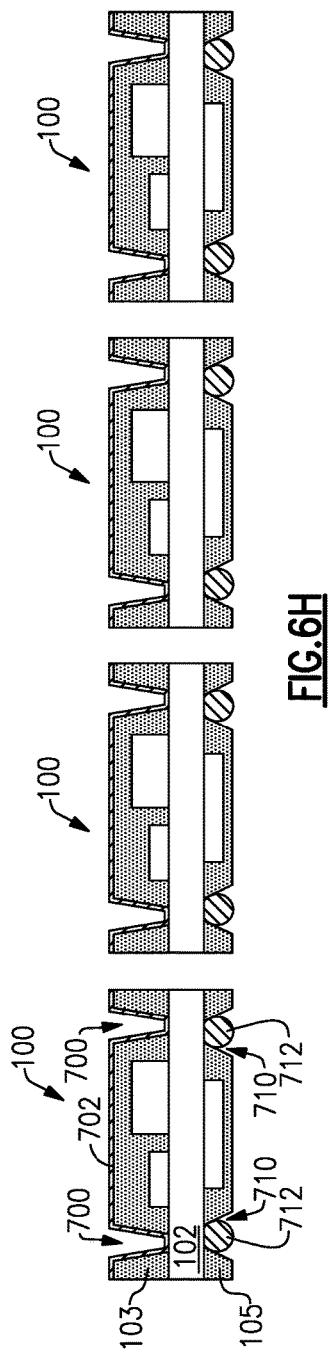
FIG. 6H illustrates a plurality of dual-sided shielded RF modules, in accordance with some implementations.

FIG. 6H shows that a conductive layer 702 can be formed in a conformal manner so as to cover the upper surface of the overmold 136, the surface of each TMV 700, and the exposed portion of the corresponding contact pad. Accordingly, the conductive layer 702 on the upper surface of the overmold 136 can be electrically connected to the ground planes in the panel 130 through the respective conductive-material-coated TMVs. Such a conformal coating of conductive material can be applied by, for example, a deposition process such as a physical vapor deposition (PVD) process.

FIG. 6I shows that the assembly of FIG. 4I can be singulated into a plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module shielding and/or overall shielding for the module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

Figure 7A:
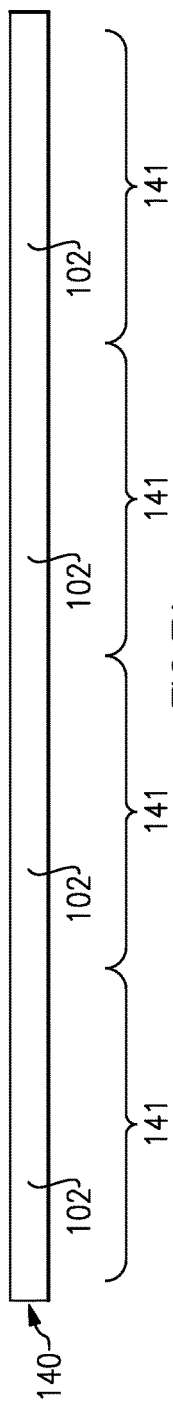
FIG. 7A illustrates a packaging substrate panel, in accordance with some implementations.

FIG. 7A shows a panel 140 having a plurality of units 141, where each unit is configured to become a packaging substrate 102 once singulated. Each unit 141 can include one or more contact pads on its upper side, and it is assumed that each of such contact pad(s) is electrically connected to a ground plane within the packaging substrate 102. Each unit 141 can also include a plurality of contact pads on its underside, and it is assumed that each of such contact pads are configured to facilitate mounting of one or more components and/or to receive conductive features such as solder balls.

Figure 7B:
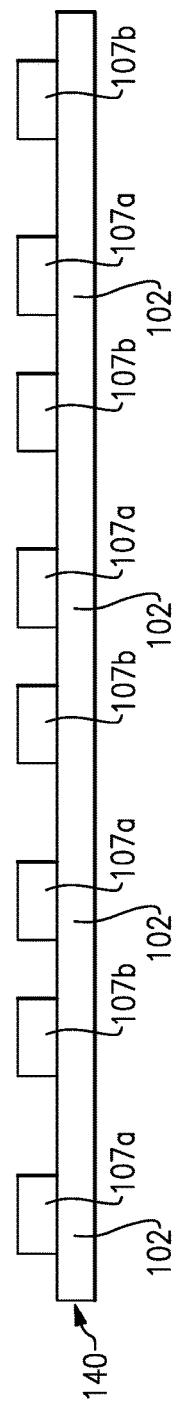
FIG. 7B illustrates a plurality of components mounted on the upper side of a packaging substrate, in accordance with some implementations.

FIG. 7B shows a plurality of components 107a, 107b mounted on the upper side of the packaging substrate 102 for each unit 141 of the panel 140. Such components can include, for example, one or more die having respective integrated circuit(s), one or more surface mount devices (SMDs) such as passive components, or some combination thereof. Such components can be parts of an RF circuit assembly.

Figure 7C:
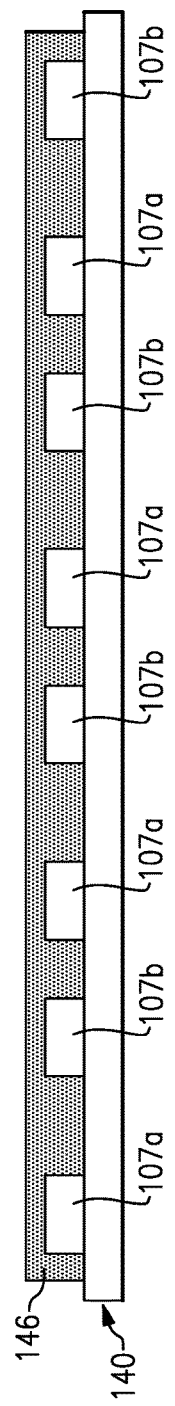
FIG. 7C illustrates a first overmold structure formed over a packaging substrate panel, in accordance with some implementations.

FIG. 7C shows that a first overmold structure 146 can be formed over the packaging substrate panel 140 so as to cover each set of one or more components 107a, 107b associated with the corresponding unit.

FIG. 7D shows a plurality of components 109 mounted on the underside of the packaging substrate panel 140. In the example shown, one component 109 is mounted on the underside of each unit 141 of the panel 140; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly. FIG. 7D also shows a plurality of solder balls 712 mounted, implemented, formed, etc., on the underside of the packaging substrate 130. The plurality of solder balls 712 may be formed on contact pads on the underside of the packaging substrate 130. Although solder balls 712 may be illustrated in FIG. 7D, one having ordinary skill in the art understands that other types of contact features, such as pillars, columns, posts, etc., may be used.

FIG. 7E shows that a second overmold structure 147 can be formed over the packaging substrate panel 140 so as to cover each set of one or more components 109 and the solder balls 712 associated with the corresponding unit. In some embodiments, the overmold structure 137 may completely cover the solder balls 712. For example, the overmold structure 137 may cover the solder balls 712 such that a thin layer (e.g., a film, a coating, a thin sheet, etc.) of the over mold material may remain deposited over the solder balls 106.

Figure 7F:
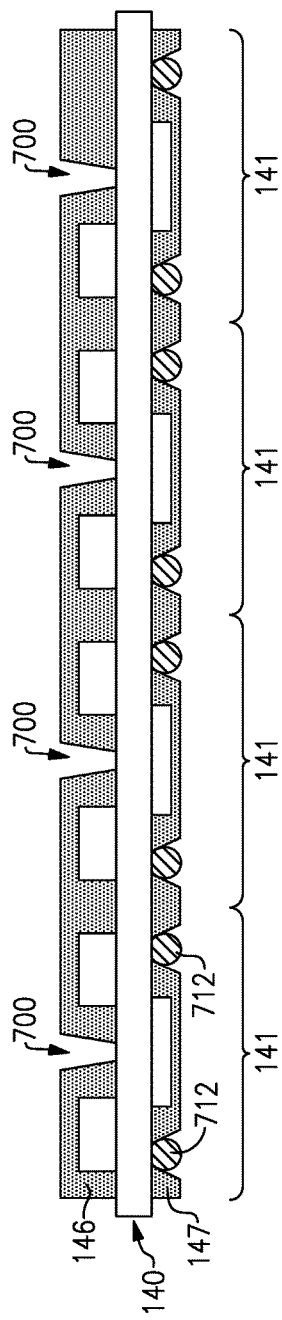
FIG. 7F illustrates a first overmold structure having one or more openings, in accordance with some implementations.

FIG. 7F shows that one or more openings such as through-mold vias (TMVs) 700 can be formed through the first overmold structure 146. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed. FIG. 7F also shows portions of the second overmold structure 147 may be removed. For example, a laser may be used to burn or melt portions of the second overmold structure 147 around the solder balls 712 to expose the solder balls through the second overmold structure 147. The assembly of FIG. 7F may be oriented and prepared to be singulated. It will be understood that the assembly of FIG. 7F can also be singulated in the orientation as shown in FIG. 7F.

Figure 7G:
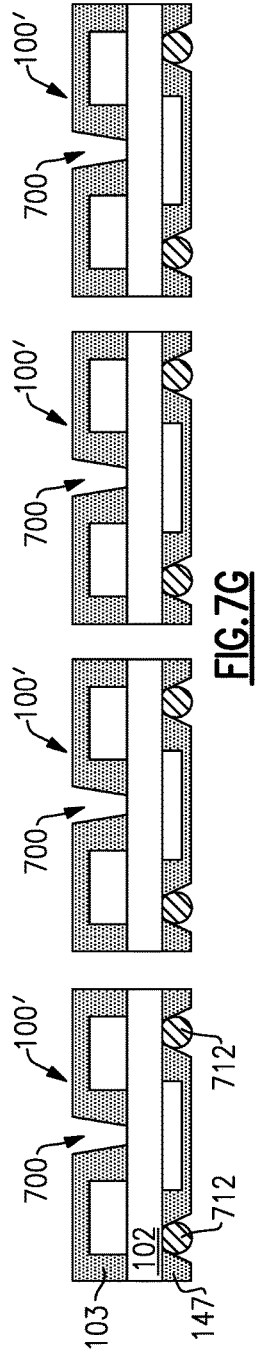
FIG. 7G illustrates a packaging substrate panel with a solder ball provided into each of the openings formed on the second overmold structure, in accordance with some implementations.

FIG. 7G show a plurality of unshielded modules 100' resulting from a singulation process. Such unshielded modules can be process further utilizing, for example, a stencil. Additional details concerning such stencil based processing of singulated devices are disclosed in Appendix A.

Figure 7H:
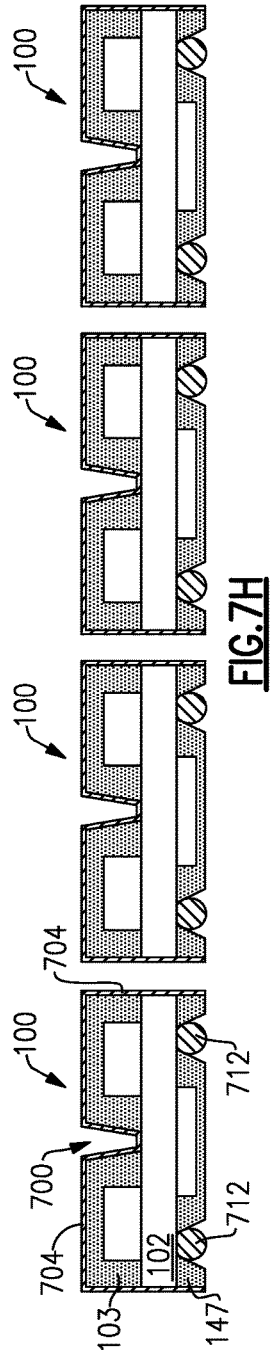
FIG. 7H illustrates a plurality of dual-sided shielded RF modules, in accordance with some implementations.

FIG. 7H shows that a conductive layer 704 can be formed in a conformal manner so as to cover the upper surface of the overmold 103 of each module, the surface of each TMV 700, the exposed portion of the corresponding contact pad, and the side walls of the module. Accordingly, the conductive layer 704 generally covering the upper side and side walls of the module can be electrically connected to the ground plane corresponding packaging substrate 102 through the respective conductive-material-coated TMVs and through conductive features exposed on the side walls. Such a conformal coating of conductive material can be applied by, for example, a deposition process such as a physical vapor deposition (PVD) process. FIG. 7H also shows the resulting plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

Figure 8A:
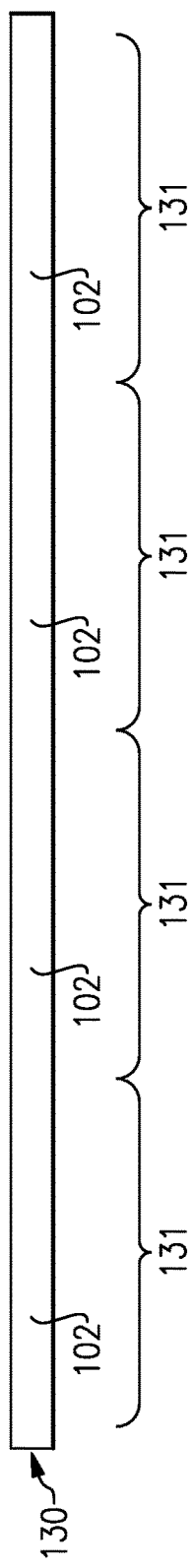
FIG. 8A illustrates a packaging substrate panel, in accordance with some implementations.

FIG. 8A shows a panel 130 having a plurality of units 131, where each unit is configured to become a packaging substrate 102 once singulated. Each unit 131 can include one or more contact pads on its upper side, and it is assumed that each of such contact pad(s) is electrically connected to a ground plane within the packaging substrate 102. Each unit 131 can also include a plurality of contact pads on its underside, and it is assumed that each of such contact pads are configured to facilitate mounting of one or more components and/or to receive conductive features such as solder balls.

Figure 8B:
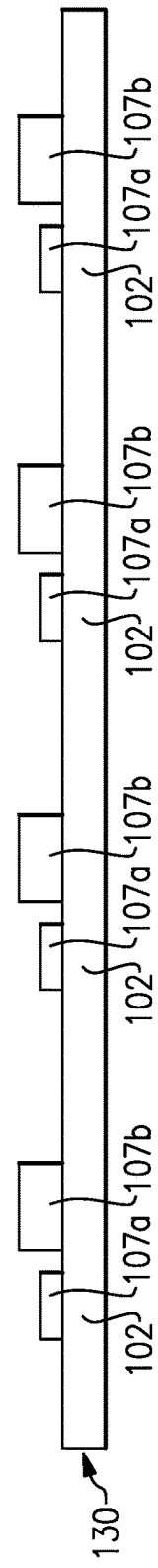
FIG. 8B illustrates a plurality of components mounted on the upper side of a packaging substrate, in accordance with some implementations.

FIG. 8B shows a plurality of components 107a, 107b mounted on the upper side of the packaging substrate 102 for each unit 131 of the panel 130. Such components can include, for example, one or more die having respective integrated circuit(s), one or more surface mount devices (SMDs) such as passive components, or some combination thereof. Such components can be parts of an RF circuit assembly.

Figure 8C:
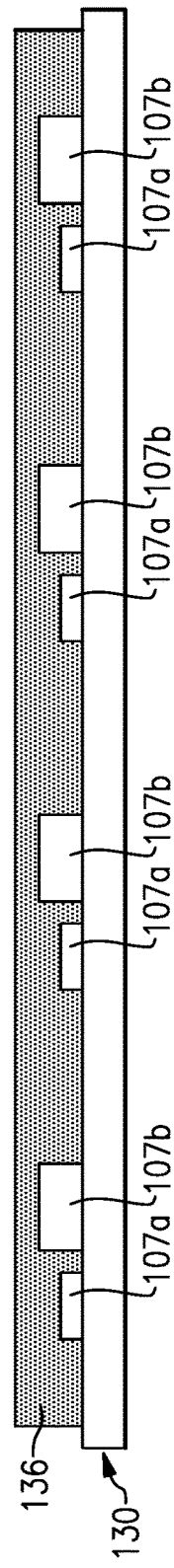
FIG. 8C illustrates a first overmold structure formed over a packaging substrate panel, in accordance with some implementations.

FIG. 8C shows that a first overmold structure 136 can be formed over the packaging substrate panel 130 so as to cover each set of one or more components 107a, 107b associated with the corresponding unit.

FIG. 8D shows a plurality of components 109 mounted on the underside of the packaging substrate panel 130. In the example shown, one component 109 is mounted on the underside of each unit 131 of the panel 130; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly. FIG. 8D also shows a plurality of solder balls 712 mounted, implemented, formed, etc., on the underside of the packaging substrate 130. The plurality of solder balls 712 may be formed on contact pads on the underside of the packaging substrate 130. Although solder balls 712 may be illustrated in FIG. 6D, one having ordinary skill in the art understands that other types of contact features, such as pillars, columns, posts, etc., may be used.

FIG. 8E shows that a second overmold structure 137 can be formed over the packaging substrate panel 130 so as to cover each set of one or more components 109 and the solder balls 712 associated with the corresponding unit. In some embodiments, the overmold structure 137 may completely cover the solder balls 712. For example, the overmold structure 137 may cover the solder balls 712 such that a thin layer (e.g., a film, a coating, a thin sheet, etc.) of the over mold material may remain deposited over the solder balls 106.

FIG. 8F shows that portions of the overmold structure 137 and the solder balls 712 may be removed. For example, the bottom surface (which is illustrated as facing up) may be ablated, ground, etc., to remove portions of the overmold structure 137 and the solder balls 712. This may expose the solder balls 712 through the overmold structure 712.

FIG. 8G shows that one or more openings such as through-mold vias (TMVs) 700 can be formed through the first overmold structure 136. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed. The assembly illustrated in FIG. 6F may be oriented and prepared to receive a conductive layer on the first overmold structure 136.

FIG. 8G shows that a conductive layer 702 can be formed in a conformal manner so as to cover the upper surface of the overmold 136, the surface of each TMV 700, and the exposed portion of the corresponding contact pad. Accordingly, the conductive layer 702 on the upper surface of the overmold 136 can be electrically connected to the ground planes in the panel 130 through the respective conductive-material-coated TMVs. Such a conformal coating of conductive material can be applied by, for example, a deposition process such as a physical vapor deposition (PVD) process.

FIG. 8I shows that the assembly of FIG. 8I can be singulated into a plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module shielding and/or overall shielding for the module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

FIG. 9A shows a panel 140 having a plurality of units 141, where each unit is configured to become a packaging substrate 102 once singulated. Each unit 141 can include one or more contact pads on its upper side, and it is assumed that each of such contact pad(s) is electrically connected to a ground plane within the packaging substrate 102. Each unit 141 can also include a plurality of contact pads on its underside, and it is assumed that each of such contact pads are configured to facilitate mounting of one or more components and/or to receive conductive features such as solder balls.

FIG. 9B shows a plurality of components 107a, 107b mounted on the upper side of the packaging substrate 102 for each unit 141 of the panel 140. Such components can include, for example, one or more die having respective integrated circuit(s), one or more surface mount devices (SMDs) such as passive components, or some combination thereof. Such components can be parts of an RF circuit assembly.

FIG. 9C shows that a first overmold structure 146 can be formed over the packaging substrate panel 140 so as to cover each set of one or more components 107a, 107b associated with the corresponding unit.

FIG. 9D shows a plurality of components 109 mounted on the underside of the packaging substrate panel 140. In the example shown, one component 109 is mounted on the underside of each unit 141 of the panel 140; however, it will be understood that more than one component can be mounted thereto. Such components can include, for example, one or more die having respective integrated circuit(s), one or more surface mount devices (SMDs) such as passive components, or some combination thereof. Such components can be parts of an RF circuit assembly. FIG. 9D also shows a plurality of solder balls 712 mounted, implemented, formed, etc., on the underside of the packaging substrate 130. The plurality of solder balls 712 may be formed on contact pads on the underside of the packaging substrate 130. Although solder balls 712 may be illustrated in FIG. 9D, one having ordinary skill in the art understands that other types of contact features, such as pillars, columns, posts, etc., may be used.

FIG. 9D shows that a second overmold structure 147 can be formed over the packaging substrate panel 140 so as to cover each set of one or more components 109 and the solder balls 712 associated with the corresponding unit. In some embodiments, the overmold structure 137 may completely cover the solder balls 712. For example, the overmold structure 137 may cover the solder balls 712 such that a thin layer (e.g., a film, a coating, a thin sheet, etc.) of the over mold material may remain deposited over the solder balls 106.

FIG. 9E shows that portions of the overmold structure 137 and the solder balls 712 may be removed. For example, the bottom surface (which is illustrated as facing up) may be ablated, ground, etc., to remove portions of the overmold structure 137 and the solder balls 712. This may expose the solder balls 712 through the overmold structure 712.

FIG. 9F shows that one or more openings such as through-mold vias (TMVs) 700 can be formed through the first overmold structure 146. Such TMVs can be formed to expose at least some of the corresponding contact pads on the first side of the packaging substrate. In some embodiments, such TMVs can be formed by, for example, laser drilling configured to burn through the first overmold material and generally stop once the contact pads are exposed. The assembly of FIG. 7F may be oriented and prepared to be singulated. It will be understood that the assembly of FIG. 7F can also be singulated in the orientation as shown in FIG. 7F.

FIG. 9G show a plurality of unshielded modules 100' resulting from a singulation process. Such unshielded modules can be process further utilizing, for example, a stencil. Additional details concerning such stencil based processing of singulated devices are disclosed in Appendix A.

FIG. 9G shows that a conductive layer 704 can be formed in a conformal manner so as to cover the upper surface of the overmold 103 of each module, the surface of each TMV 700, the exposed portion of the corresponding contact pad, and the side walls of the module. Accordingly, the conductive layer 704 generally covering the upper side and side walls of the module can be electrically connected to the ground plane corresponding packaging substrate 102 through the respective conductive-material-coated TMVs and through conductive features exposed on the side walls. Such a conformal coating of conductive material can be applied by, for example, a deposition process such as a physical vapor deposition (PVD) process. FIG. 9G also shows the resulting plurality of dual-sided shielded RF modules 100, each having one or more components mounted on the first side (e.g., upper side) of the corresponding packaging substrate 102, and one or more components mounted on the second side (e.g., underside) of the same packaging substrate 102. As described herein, the conductive-material-coated TMVs provide an electrical connection between the conductive layer on the upper surface of the overmold 103 of each module 100 and the contact pads (which are in turn electrically connected to a ground plane), to thereby provide shielding functionality (e.g., intra-module). As also described herein, such conductive-material-coated TMVs can replace shielding wirebonds, thereby eliminating process steps such as formation of shielding wirebonds, exposing of upper portions of such shielding wirebonds (e.g., utilizing micro-ablation technique), and formation of a conductive layer such as a painted metal layer to accommodate such shielding wirebonds.

As also described herein, the array of solder balls 712 implemented on the underside of the packaging substrate 102 in the corresponding openings 710 in the overmold 105 can allow the module 100 to be mounted on a circuit board. Additional details concerning such mounting with use of the solder ball array are described in Appendix B.

In some implementations, a device and/or a circuit having one or more features described herein can be included in an RF electronic device such as a wireless device. In some embodiments, such a wireless device can include, for example, a cellular phone, a smart-phone, a hand-held wireless device with or without phone functionality, a wireless tablet, etc.

Figure 10:
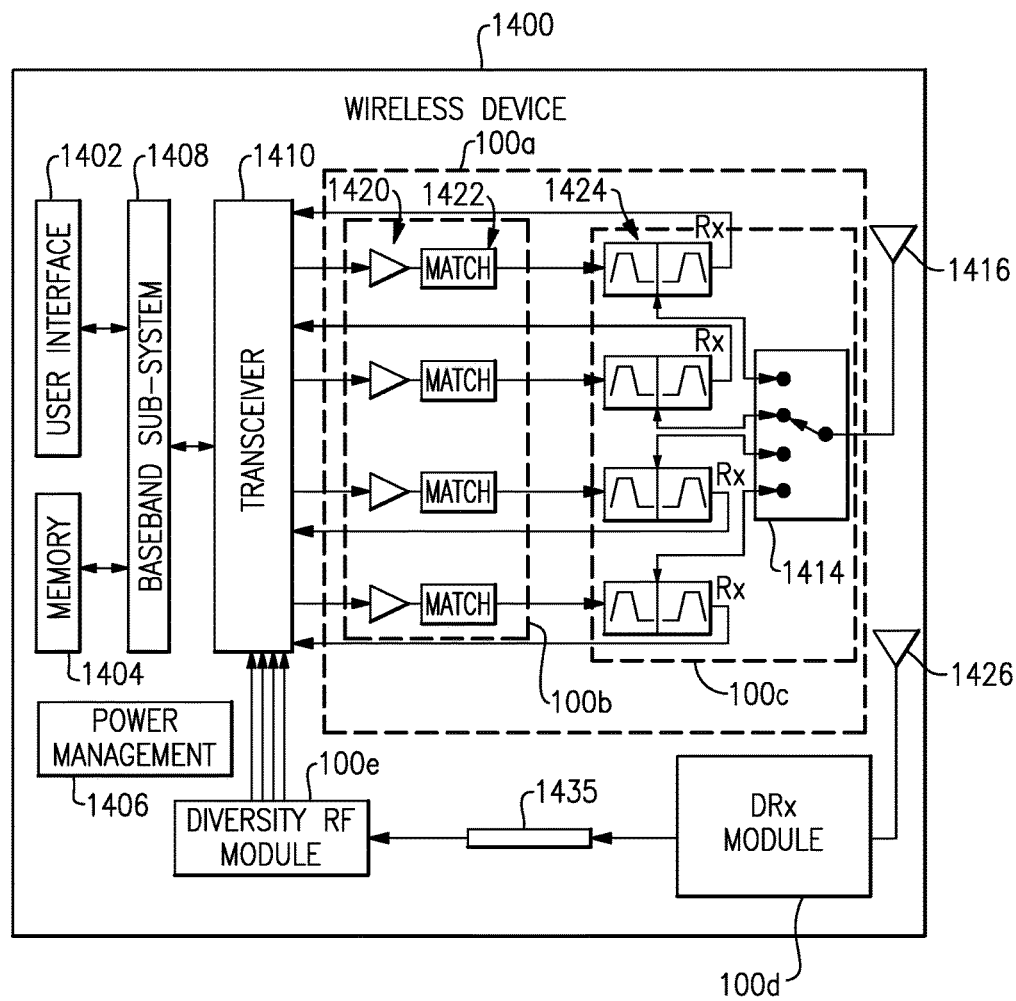
FIG. 10 depicts an example wireless device having one or more advantageous features described herein.

FIG. 10 depicts an example wireless device 1400 having one or more advantageous features described herein. In the example of FIG. 15, a shielded RF module having one or more features as described herein can be implemented in a number of places. For example, a shielded RF module may be implemented as a front-end module (FEM) indicated as 100a. In another example, a shielded RF module may be implemented as a power amplifier module (PAM) indicated as 100b. In another example, a shielded RF module may be implemented as an antenna switch module (ASM) indicated as 100c. In another example, a shielded RF module may be implemented as a diversity receive (DRx) module indicated as 100d. It will be understood that a shielded RF module having one or more features as described herein can be implemented with other combinations of components.

Referring to FIG. 10, power amplifiers (PAs) 1420 can receive their respective RF signals from a transceiver 1410 that can be configured and operated to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 can also be in communication with a power management component 1406 that is configured to manage power for the operation of the wireless device 1400.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example wireless device 1400, outputs of the PAs 1420 are shown to be matched (via respective match circuits 1422) and routed to their respective duplexers 1424. Such amplified and filtered signals can be routed to a primary antenna 1416 through an antenna switch 1414 for transmission. In some embodiments, the duplexers 1424 can allow transmit and receive operations to be performed simultaneously using a common antenna (e.g., primary antenna 1416). In FIG. 10, received signals are shown to be routed to "Rx" paths that can include, for example, a low-noise amplifier (LNA).

In the example of FIG. 10, the wireless device 1400 also includes the diversity antenna 1426 and the shielded DRx module 100d that receives signals from the diversity antenna 1426. The shielded DRx module 100d processes the received signals and transmits the processed signals via a transmission line 1435 to a diversity RF module 1411 that further processes the signal before feeding the signal to the transceiver 1410.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A dual-sided module comprising:
a packaging substrate having an upper side, a lower side, and a ground plane;
a radio-frequency circuit assembly implemented on both of the upper and lower sides of the packaging substrate;
an upper overmold implemented on the upper side of the packaging substrate to cover an upper portion of the radio-frequency circuit assembly, the upper overmold defining one or more openings dimensioned to expose one or more contact pads on the upper side of the packaging substrate, the one or more contact pads in electrical connection with the ground plane;
a conductive layer configured to cover an upper surface and the one or more openings of the upper overmold to be in electrical contact with the ground plane to thereby provide shielding for a region on the upper side of the packaging substrate;
a lower overmold implemented on the lower side of the packaging substrate to cover a lower portion of the radio-frequency circuit assembly, the lower overmold defining a plurality of openings; and
a contact feature implemented within each of the openings of the lower overmold to be in contact with the packaging substrate, such that the resulting contact features allow the dual-sided module to be mounted on a circuit board.

2. The dual-sided module of claim 1 wherein the one or more openings defined by the upper overmold includes one or more through-mold vias.

3. The dual-sided module of claim 2 wherein the one or more through-mold vias are configured to provide shielding between the region on the upper side of the packaging substrate and another location.

4. The dual-sided module of claim 3 wherein the other location is a location that is external to the dual-sided module.

5. The dual-sided module of claim 3 wherein the other location is a location that is within the dual-sided module to thereby provide intra-module shielding.

6. The dual-sided module of claim 1 wherein the conductive layer is further configured to cover some or all of side walls defined by the dual-sided module.

7. The dual-sided module of claim 6 wherein the packaging substrate further includes a contact feature electrically connected to the ground plane and exposed on each of the side walls, such that the conductive layer on the corresponding side wall is further electrically connected to the ground plane through the contact feature.

8. The dual-sided module of claim 7 wherein the conductive layer is implemented as a conformal coating of conductive material.

9. The dual-sided module of claim 1 wherein each of the openings defined by the lower overmold includes a through-mold opening dimensioned to receive the corresponding contact feature.

10. The dual-sided module of claim 9 wherein the contact feature includes a solder ball.

11. The dual-sided module of claim 10 wherein the through-mold opening includes a side sectional profile having a maximum width at a lower surface of the lower overmold.

12. The dual-sided module of claim 11 wherein the solder ball is dimensioned and positioned within the through-mold opening such that a lower portion of the solder ball is a level that is approximately the same as the lower surface of the lower overmold.

13. The dual-sided module of claim 12 wherein the solder ball and the corresponding through-mold opening define a ring-shaped space around the lower portion of the solder ball to facilitate the mounting of the dual-sided module on the circuit board.

14. The dual-sided module of claim 1 wherein the contact features are configured as a ball grid array.

15. The dual-sided module of claim 14 wherein each opening defined by the lower overmold is implemented by the lower overmold being formed around the corresponding ball of the ball grid array.

16. The dual-sided module of claim 15 wherein the opening defined by the lower overmold includes a side sectional profile having a maximum width at a lower surface of the lower overmold.

17. The dual-sided module of claim 1 wherein the lower portion of the radio-frequency circuit assembly includes a semiconductor die having a radio-frequency circuit.

18. The dual-sided module of claim 17 wherein the lower overmold is dimensioned to substantially encapsulate the semiconductor die.

19. A method for manufacturing a dual-sided module, the method comprising:
providing or forming a packaging substrate having an upper side, a lower side, and a ground plane;
implementing a radio-frequency circuit assembly on both of the upper and lower sides of the packaging substrate;
forming an upper overmold on the upper side of the packaging substrate to cover an upper portion of the radio-frequency circuit assembly;
forming one or more openings through the upper overmold to expose one or more contact pads on the upper side of the packaging substrate, the one or more contact pads in electrical connection with the ground plane;
covering an upper surface and the one or more openings of the upper overmold with a conductive layer to be in electrical contact with the ground plane to thereby provide shielding for a region on the upper side of the packaging substrate;
forming a lower overmold on the lower side of the packaging substrate to cover a lower portion of the radio-frequency circuit assembly;

forming a plurality of openings through the lower overmold to expose corresponding contact pads on the lower side of the packaging substrate; and implementing a contact feature within each of the openings of the lower overmold to be in contact with the corresponding contact pad, such that the resulting contact features allow the dual-sided module to be mounted on a circuit board.

20. A wireless device comprising:

a circuit board configured to receive a plurality of components;

a transceiver implemented on the circuit board and configured to process radio-frequency signals; and a dual-sided module implemented on the circuit board and in communication with the transceiver, the dual-sided module including a packaging substrate having an upper side, a lower side, and a ground plane, a radio-frequency circuit assembly implemented on both of the upper and lower sides of the packaging substrate, an upper overmold implemented on the upper side of the packaging substrate to cover an upper portion of the radio-frequency circuit assembly, the upper overmold defining one or more openings dimensioned to expose one or more contact pads on the upper side of the packaging substrate, the one or more contact pads in electrical connection with the ground plane, a conductive layer configured to cover an upper surface and the one or more openings of the upper overmold to be in electrical contact with the ground plane to thereby provide shielding for a region on the upper side of the packaging substrate, a lower overmold implemented on the lower side of the packaging substrate to cover a lower portion of the radio-frequency circuit assembly, the lower overmold defining a plurality of openings, and a contact feature implemented within each of the openings of the lower overmold to allow the dual-sided module to be mounted on a circuit board.

* * * * *